United States Patent
Harigai et al.

(10) Patent No.: US 8,288,020 B2
(45) Date of Patent: Oct. 16, 2012

(54) PIEZOELECTRIC THIN FILM AND METHOD OF MANUFACTURING THE SAME, INK JET HEAD, METHOD OF FORMING IMAGE WITH THE INK JET HEAD, ANGULAR VELOCITY SENSOR, METHOD OF MEASURING ANGULAR VELOCITY WITH THE ANGULAR VELOCITY SENSOR, PIEZOELECTRIC GENERATING ELEMENT, AND METHOD OF GENERATING ELECTRIC POWER WITH THE PIEZOELECTRIC GENERATING ELEMENT

(75) Inventors: Takakiyo Harigai, Kyoto (JP); Hideaki Adachi, Osaka (JP); Eiji Fujii, Osaka (JP)

(73) Assignee: Panasonic Corporation, Osaka (JP)

( * ) Notice: Subject to any disclaimer, the term of this patent is extended or adjusted under 35 U.S.C. 154(b) by 4 days.

(21) Appl. No.: 12/956,772

(22) Filed: Nov. 30, 2010

(65) Prior Publication Data

US 2011/0143146 A1   Jun. 16, 2011

Related U.S. Application Data

(63) Continuation of application No. PCT/JP2010/001472, filed on Mar. 3, 2010.

(30) Foreign Application Priority Data

Apr. 20, 2009 (JP) ................. 2009-101815

(51) Int. Cl.
*H01L 41/18* (2006.01)
*H01L 41/047* (2006.01)
*H01L 41/113* (2006.01)
*B41J 2/045* (2006.01)
*G01C 19/56* (2006.01)
*B32B 9/04* (2006.01)
*C23C 14/08* (2006.01)

(52) U.S. Cl. ........ 428/697; 428/446; 428/469; 428/701; 428/702; 310/323.01; 204/192.18; 347/9; 347/70; 73/504.12

(58) Field of Classification Search ........................ None
See application file for complete search history.

(56) References Cited

U.S. PATENT DOCUMENTS 6,617,062 B2 *  9/2003  Chang ........................ 428/701
(Continued)

FOREIGN PATENT DOCUMENTS

JP     62-202576    9/1987
(Continued)

OTHER PUBLICATIONS

Tadashi Takenaka et al., "$(Bi_{frac;1;2}Na_{frac;1;2})TiO_3$-$BaTiO_3$ System for Lead-Free Piezoelectric Ceramics," Japanese Journal of Applied Physics, vol. 30, No. 9B, pp. 2236-2239, Sep. 1991.

(Continued)

*Primary Examiner* — Jennifer McNeil
*Assistant Examiner* — Vera Katz
(74) *Attorney, Agent, or Firm* — McDermott Will & Emery LLP

(57) ABSTRACT

Provided are a piezoelectric thin film including a lead-free ferroelectric material and exhibiting high piezoelectric performance comparable to that of lead zirconate titanate (PZT), and a method of manufacturing the piezoelectric thin film. The piezoelectric thin film of the present invention comprises: a $LaNiO_3$ film having a (001) orientation; a $NaNbO_3$ film having a (001) orientation; and a (Bi, Na, Ba) $TiO_3$ film having a (001) orientation. The $LaNiO_3$ film, the $NaNbO_3$ film, and the (Bi, Na, Ba)$TiO_3$ film are laminated in this order.

17 Claims, 24 Drawing Sheets

U.S. PATENT DOCUMENTS

| | | | |
|---|---|---|---|
| 6,876,536 B2 | 4/2005 | Sakashita et al. | |
| 6,943,397 B2 | 9/2005 | Kondo et al. | |
| 7,033,001 B2 | 4/2006 | Fujii et al. | |
| 7,622,850 B2 | 11/2009 | Iwashita et al. | |
| 7,652,408 B2 * | 1/2010 | Fujii | 310/311 |
| 7,732,996 B2 * | 6/2010 | Shibata et al. | 310/358 |
| 7,965,021 B2 * | 6/2011 | Harigai et al. | 310/358 |
| 2003/0022030 A1 * | 1/2003 | Chang | 428/701 |
| 2004/0028838 A1 * | 2/2004 | Chang | 427/596 |
| 2007/0236104 A1 * | 10/2007 | Fujii | 310/358 |
| 2009/0160914 A1 * | 6/2009 | Fujii | 347/68 |

FOREIGN PATENT DOCUMENTS

| | | |
|---|---|---|
| JP | 4-60073 | 9/1992 |
| JP | 10-139552 | 5/1998 |
| JP | 3481235 | 12/2003 |
| JP | 2006-069837 | 3/2006 |
| JP | 2006-186258 | 7/2006 |
| JP | 3844972 | 11/2006 |
| JP | 2007-019302 | 1/2007 |
| JP | 2007-266346 | 10/2007 |
| JP | 4040397 | 1/2008 |
| WO | WO 2004/061881 | 7/2004 |

OTHER PUBLICATIONS

Z.H. Zhou et al., "Ferroelectric and electrical behavior of $(Na_{0.5}Bi_{0.5})TiO_3$ thin films," Applied Physics Letters, vol. 85, No. 5, pp. 804-806, Aug. 2, 2004.

Hong-Wei Cheng et al., "Combinatorial studies of $(1-\chi)Na_{0.5}Bi_{0.5}TiO_3$-$\chi BaTiO_3$ thin-film chips," Applied Physics Letters, vol. 85, No. 12, pp. 2319-2321, Sep. 20, 2004.

* cited by examiner

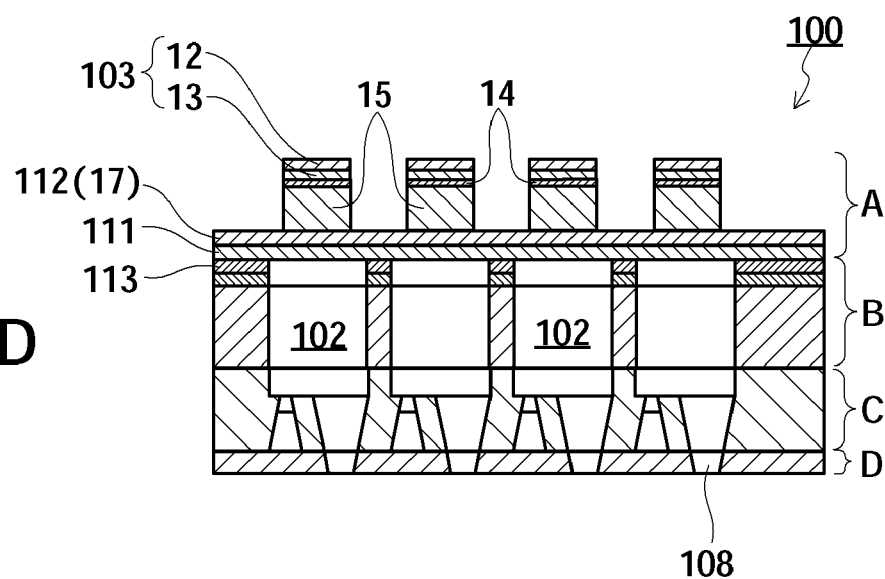

PIEZOELECTRIC THIN FILM AND METHOD OF MANUFACTURING THE SAME, INK JET HEAD, METHOD OF FORMING IMAGE WITH THE INK JET HEAD, ANGULAR VELOCITY SENSOR, METHOD OF MEASURING ANGULAR VELOCITY WITH THE ANGULAR VELOCITY SENSOR, PIEZOELECTRIC GENERATING ELEMENT, AND METHOD OF GENERATING ELECTRIC POWER WITH THE PIEZOELECTRIC GENERATING ELEMENT

RELATED APPLICATIONS

This is a continuation of PCT International Application PCT/JP2010/001472, filed on Mar. 3, 2010, which in turn claims the benefit of Japanese Application No. 2009-101815, filed on Apr. 20, 2009, the disclosures of which Applications are incorporated by reference herein.

BACKGROUND OF THE INVENTION

1. Field of the Invention

The present invention relates to a piezoelectric thin film including a piezoelectric layer and a method of manufacturing the same. The present invention further relates to an ink jet head including the piezoelectric thin film and a method of forming an image with the head, to an angular velocity sensor including the piezoelectric thin film and a method of measuring an angular velocity with the sensor, and to a piezoelectric generating element including the piezoelectric thin film and a method of generating electric power with the element.

2. Description of Related Art

Lead zirconate titanate (PZT: $Pb(Zr_xTi_{1-x})O_3$, $0<x<1$) is a typical ferroelectric material capable of storing a large amount of electric charge. PZT is used in capacitors and thin film memories. PZT has pyroelectricity and piezoelectricity based on the ferroelectricity thereof. PZT has high piezoelectric performance. A mechanical quality factor Qm of PZT can be controlled easily by adjusting the composition or adding an element thereto. These facts allow PZT to be applied to sensors, actuators, ultrasonic motors, filter circuits, and oscillators.

PZT, however, contains a large amount of lead. In recent years, there has been a growing concern that lead leached from waste may cause serious damage to the ecosystem and the environment. Accordingly, there has been an international movement toward restricting the use of lead. For this reason, non-lead-containing ferroelectric materials (lead-free ferroelectric materials) unlike PZT have been in demand.

One example of the lead-free ferroelectric materials that are currently under development is a perovskite-type composite oxide $[(Bi_{0.5}Na_{0.5})_{1-y}Ba_y]TiO_3$ made of bismuth (Bi), sodium (Na), barium (Ba), and titanium (Ti). JP 4(1992)-60073 B and T. Takenaka et al., Japanese Journal of Applied Physics, Vol. 30, No. 9B, (1991), pp. 2236-2239 disclose that this ferroelectric material exhibits high piezoelectric performance of about 125 pC/N in terms of a piezoelectric constant $d_{33}$, when the content of barium y(=[Ba/(Bi+Na+Ba)]) is 5% to 10%. The piezoelectric performance of the ferroelectric material is, however, lower than that of PZT.

JP 2007-266346 A, H. W. Cheng et al., Applied Physics Letters, Vol. 85, (2004), pp. 2319-2321, and Z. H. Zhou et al., Applied Physics Letters, Vol. 85, (2004), pp. 804-806 disclose that a (Bi,Na,Ba)TiO_3 film that is oriented in a specific direction is fabricated. It is expected that the alignment of the polarization axes in the (Bi,Na,Ba)TiO_3 film with the orientation improves the ferroelectric properties of the film, such as remanent polarization and piezoelectric performance.

However, unlike a (Bi, Na, Ba)TiO_3 bulk, the (Bi, Na, Ba)TiO_3 thin film has a leak current. T. Takenaka et al., Japanese Journal of Applied Physics, Vol. 30, No. 9B, (1991), pp. 2236-2239 discloses a (Bi, Na, Ba)TiO_3 disc with a thickness of 1 mm and a dielectric loss tan δ of about 1%. On the other hand, Z. H. Zhou et al., Applied Physics Letters, Vol. 85, (2004), pp. 804-806 discloses that a (Bi, Na)TiO_3 thin film has a dielectric loss reaching 20% in a low frequency region of kilohertz or less. The ferroelectric properties of the (Bi, Na, Ba)TiO_3 film, which has a large leak current, are deteriorated significantly. Thus, it is necessary to suppress the leak current of the (Bi, Na, Ba)TiO_3 film.

JP 2007-019302 A discloses a piezoelectric thin film in which a NaNbO_3 film is sandwiched between a substrate and a piezoelectric layer composed of a niobic acid compound ((Na, K, Li)NbO_3).

SUMMARY OF THE INVENTION

It is an object of the present invention to provide a lead-free piezoelectric thin film including a lead-free ferroelectric material and having a low dielectric loss, and high piezoelectric performance comparable to that of PZT, and a method of manufacturing the piezoelectric thin film.

It is another object of the present invention to provide an ink jet head, an angular velocity sensor, and a piezoelectric generating element, each including the lead-free piezoelectric thin film. It is still another object of the present invention to provide a method of forming an image with this ink jet head, a method of measuring an angular velocity with this angular velocity sensor, and a method of generating electric power with this piezoelectric generating element.

The present inventors have discovered the following: (i) a LaNiO_3 film formed on a base layer has a (001) orientation, regardless of the composition and crystal structure of the base layer; and (ii) the formation of an interface layer composed of NaNbO_3 on the LaNiO_3 film, and the formation of a (Bi, Na, Ba)TiO_3 film as a piezoelectric layer further on the interface layer allow the resulting (Bi, Na, Ba)TiO_3 film to have high crystallinity, high (001) orientation, low dielectric loss, and high piezoelectric performance. The present inventors have completed the present invention based on these findings.

The piezoelectric thin film of the present invention comprises: a LaNiO_3 film having a (001) orientation; a NaNbO_3 film having a (001) orientation; and a (Bi, Na, Ba)TiO_3 film having a (001) orientation. The LaNiO_3 film, the NaNbO_3 film, and the (Bi, Na, Ba)TiO_3 film are laminated in this order.

The method of the present invention for manufacturing a piezoelectric thin film includes the steps of: forming a LaNiO_3 film having a (001) orientation by sputtering; forming a NaNbO_3 film having a (001) orientation on the LaNiO_3 film by sputtering; and forming a (Bi, Na, Ba)TiO_3 film having a (001) orientation on the NaNbO_3 film by sputtering to obtain a piezoelectric thin film in which the LaNiO_3 film, the NaNbO_3 film, and the (Bi, Na, Ba)TiO_3 film are laminated in this order.

The ink jet head of the present invention includes: a piezoelectric thin film having a piezoelectric layer sandwiched between a first electrode and a second electrode; a vibration layer bonded to the piezoelectric thin film; and a pressure chamber member having a pressure chamber for storing ink and bonded to a surface of the vibration layer opposite to a surface to which the piezoelectric thin film is bonded. The vibration layer is bonded to the piezoelectric thin film so that the vibration layer is displaceable in its film thickness direction according to a deformation of the piezoelectric thin film produced by a piezoelectric effect. The vibration layer and the pressure chamber member are bonded to each other so that a volumetric capacity of the pressure chamber changes according to a displacement of the vibration layer and so that the ink in the pressure chamber is ejected according to a change in the volumetric capacity of the pressure chamber. The first electrode comprises a $LaNiO_3$ film having a (001) orientation. The piezoelectric layer is composed of a $(Bi, Na, Ba)TiO_3$ film having a (001) orientation. A $NaNbO_3$ film having a (001) orientation is sandwiched between the first electrode and the piezoelectric layer. The $LaNiO_3$ film, the $NaNbO_3$ film, the $(Bi, Na, Ba)TiO_3$ film, and the second electrode are laminated in this order.

The method of the present invention for forming an image with an ink jet head includes: a step of preparing the ink jet head; and the following step A. In this method, the ink jet head includes: a piezoelectric thin film having a piezoelectric layer sandwiched between a first electrode and a second electrode; a vibration layer bonded to the piezoelectric thin film; and a pressure chamber member having a pressure chamber for storing ink and bonded to a surface of the vibration layer opposite to a surface to which the piezoelectric thin film is bonded. The vibration layer is bonded to the piezoelectric thin film so that the vibration layer is displaceable in its film thickness direction according to a deformation of the piezoelectric thin film produced by a piezoelectric effect. The vibration layer and the pressure chamber member are bonded to each other so that a volumetric capacity of the pressure chamber changes according to a displacement of the vibration layer and so that the ink in the pressure chamber is ejected according to a change in the volumetric capacity of the pressure chamber. The first electrode comprises a $LaNiO_3$ film having a (001) orientation. The piezoelectric layer is composed of a $(Bi, Na, Ba)TiO_3$ film having a (001) orientation. A $NaNbO_3$ film having a (001) orientation is sandwiched between the first electrode and the piezoelectric layer. The $LaNiO_3$ film, the $NaNbO_3$ film, the $(Bi, Na, Ba)TiO_3$ film, and the second electrode are laminated in this order. The above-mentioned step A is a step of applying a voltage to the piezoelectric layer through the first electrode and the second electrode to displace, based on the piezoelectric effect, the vibration layer in its film thickness direction so that the volumetric capacity of the pressure chamber changes and the ink is ejected from the pressure chamber by the displacement, to form an image.

The angular velocity sensor of the present invention includes: a substrate having a vibration part; and a piezoelectric thin film bonded to the vibration part and having a piezoelectric layer sandwiched between a first electrode and a second electrode. The first electrode comprises a $LaNiO_3$ film having a (001) orientation. The piezoelectric layer is composed of a $(Bi, Na, Ba)TiO_3$ film having a (001) orientation. A $NaNbO_3$ film having a (001) orientation is sandwiched between the first electrode and the piezoelectric layer. The $LaNiO_3$ film, the $NaNbO_3$ film, the $(Bi, Na, Ba)TiO_3$ film, and the second electrode are laminated in this order. One electrode selected from the first and second electrodes is composed of an electrode group including a drive electrode for applying a driving voltage that oscillates the vibration part to the piezoelectric layer and a sense electrode for measuring a deformation of the vibration part caused by an angular velocity applied to the vibration part that is oscillating.

The method of the present invention for measuring an angular velocity with an angular velocity sensor includes: a step of preparing the angular velocity sensor; and the following steps B and C. In this method, the angular velocity sensor includes: a substrate having a vibration part; and a piezoelectric thin film bonded to the vibration part and having a piezoelectric layer sandwiched between a first electrode and a second electrode. The first electrode comprises a $LaNiO_3$ film having a (001) orientation. The piezoelectric layer is composed of a $(Bi, Na, Ba)TiO_3$ film having a (001) orientation. A $NaNbO_3$ film having a (001) orientation is sandwiched between the first electrode and the piezoelectric layer. The $LaNiO_3$ film, the $NaNbO_3$ film, the $(Bi, Na, Ba)TiO_3$ film, and the second electrode are laminated in this order. One electrode selected from the first and second electrodes is composed of an electrode group including a drive electrode and a sense electrode. The above-mentioned step B is a step of applying a driving voltage to the piezoelectric layer through the drive electrode and the other of the first electrode and the second electrode selected therefrom to oscillate the vibration part. The above-mentioned step C is a step of measuring, through the other electrode and the sense electrode, a deformation of the vibration part caused by an angular velocity applied to the vibration part that is oscillating, to measure a value of the applied angular velocity.

The piezoelectric generating element of the present invention includes: a substrate having a vibration part; and a piezoelectric thin film bonded to the vibration part and having a piezoelectric layer sandwiched between a first electrode and a second electrode. The first electrode comprises a $LaNiO_3$ film having a (001) orientation. The piezoelectric layer is composed of a $(Bi, Na, Ba)TiO_3$ film having a (001) orientation. A $NaNbO_3$ film having a (001) orientation is sandwiched between the first electrode and the piezoelectric layer. The $LaNiO_3$ film, the $NaNbO_3$ film, the $(Bi, Na, Ba)TiO_3$ film, and the second electrode are laminated in this order.

The method of the present invention for generating electric power with a piezoelectric generating element includes: a step of preparing the piezoelectric generating element; and the following step D. In this method, the piezoelectric generating element includes: a substrate having a vibration part; and a piezoelectric thin film bonded to the vibration part and having a piezoelectric layer sandwiched between a first electrode and a second electrode. The first electrode comprises a $LaNiO_3$ film having a (001) orientation. The piezoelectric layer is composed of a $(Bi, Na, Ba)TiO_3$ film having a (001) orientation. A $NaNbO_3$ film having a (001) orientation is sandwiched between the first electrode and the piezoelectric layer. The $LaNiO_3$ film, the $NaNbO_3$ film, the $(Bi, Na, Ba)TiO_3$ film, and the second electrode are laminated in this order. The above-mentioned step D is a step of vibrating the vibration part to generate a potential difference between the first electrode and the second electrode.

The present invention provides a lead-free piezoelectric thin film exhibiting a low dielectric loss and high piezoelectric performance comparable to that of PZT.

The present invention provides an ink jet head, an angular velocity sensor, and a piezoelectric generating element, each including the lead-free piezoelectric thin film, and a method of forming an image with the ink jet head, a method of measuring an angular velocity with the angular velocity sensor, and a method of generating electric power with the piezoelectric generating element. The ink jet head of the present invention has excellent ink ejection characteristics. The method of forming an image with the ink jet head has high accuracy and high expressivity. The angular velocity sensor of the present invention has excellent sensitivity. The method of measuring an angular velocity with the angular velocity sensor has excellent angular velocity measurement sensitivity. The piezoelectric generating element of the present invention has excellent electric power generation characteristics.

The method of generating electric power with the piezoelectric generating element has excellent electric power generation efficiency.

BRIEF DESCRIPTION OF DRAWINGS

FIG. 9D is a cross-sectional view schematically showing an ink jet head obtained by the steps shown in FIG. 5A to FIG. 9C.

DETAILED DESCRIPTION OF THE INVENTION

Figure 1A:
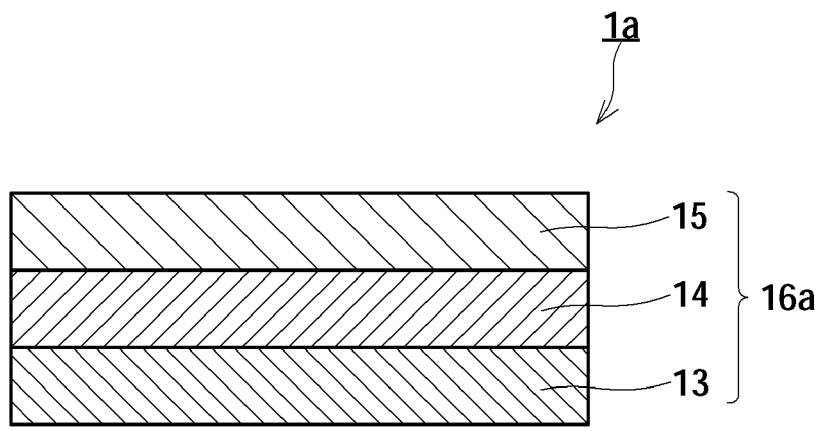
FIG. 1A is a cross-sectional view schematically showing an example of a piezoelectric thin film of the present invention.

Hereinafter, embodiments of the present invention will be described. In the following description, the same reference numerals are used to designate the same elements and parts. The overlapping description thereof can be omitted.

[Piezoelectric Thin Film and Method of Manufacturing the Same]

FIG. 1A shows one embodiment of a piezoelectric thin film according to the present invention. A piezoelectric thin film $1a$ shown in FIG. 1A has a multilayer structure $16a$. The multilayer structure $16a$ has a $LaNiO_3$ film 13 having a (001) orientation, a $NaNbO_3$ film 14 having a (001) orientation, and a $(Bi, Na, Ba)TiO_3$ film 15 having a (001) orientation in this order. These films 13 to 15 are laminated in contact with each other. The $(Bi, Na, Ba)TiO_3$ film 15 is a piezoelectric layer. The $(Bi, Na, Ba)TiO_3$ film 15 has a small leak current as well as high crystallinity and high (001) orientation. This allows the piezoelectric thin film $1a$ to have a low dielectric loss and high piezoelectric performance comparable to that of PZT, although it contains no lead.

The $LaNiO_3$ film 13 has a plane orientation of (001) on its surface. The $LaNiO_3$ film 13 has a perovskite-type crystal structure represented by the chemical formula $ABO_3$. The crystal structure has a lattice constant of 0.384 nm (pseudocubic crystal). Thus, the $LaNiO_3$ film 13 has a satisfactory lattice matching property with the $NaNbO_3$ film 14 and the $(Bi, Na, Ba)TiO_3$ film 15. The $LaNiO_3$ film 13 has a (001) orientation regardless of the composition and crystal structure of a base layer thereof. For example, the $LaNiO_3$ film 13 having a (001) orientation can be formed on a monocrystalline Si substrate having a lattice constant (0.543 nm) significantly different from that of the $LaNiO_3$ film 13. The $LaNiO_3$ film 13 having a (001) orientation can be formed also on a substrate made of metal such as stainless steel, a substrate made of an amorphous material such as glass, and a ceramic substrate.

The $LaNiO_3$ film 13 may contain a minute amount of impurities. The impurities typically are a rare earth element to substitute for La.

$LaNiO_3$ is an oxide conductor. The $LaNiO_3$ film 13 can serve as an electrode layer for applying voltage to the $(Bi, Na, Ba)TiO_3$ film 15.

Typically, the $LaNiO_3$ film 13 can be formed by sputtering. The $LaNiO_3$ film 13 can be formed also by a thin film formation technique such as pulsed laser deposition (PLD), chemical vapor deposition (CVD), sol-gel processing, and aerosol deposition (AD).

In the piezoelectric thin film manufacturing method of the present invention, sputtering is used to form the $LaNiO_3$ film 13 having a (001) orientation.

The $NaNbO_3$ film 14 has a plane orientation of (001) on its surface. The $NaNbO_3$ film 14 is an interface layer. The $NaNbO_3$ film 14 is sandwiched between the $LaNiO_3$ film 13 and the $(Bi, Na, Ba)TiO_3$ film 15. The $NaNbO_3$ film 14 is necessary to form the $(Bi, Na, Ba)TiO_3$ film 15 having high crystallinity, high (001) orientation, and a small leak current.

It is difficult to estimate an appropriate composition of the interface layer for forming a piezoelectric layer having high crystallinity, high orientation, and a small leak current based on the similarity of the lattice constants or the similarity of the compositions of these piezoelectric layer and interface layer. In other words, the above-mentioned desirable piezoelectric layer cannot be obtained simply by providing an interface layer having a lattice constant or a composition similar to that of the piezoelectric layer. This is because it is generally difficult to form a thin film composed of a composite oxide, such as $(Bi, Na, Ba)TiO_3$, and having high crystallinity and high orientation, due to a difference in the vapor pressure of each constituent element (except for oxygen) of the oxide. The present inventors have discovered that the $(Bi, Na, Ba)TiO_3$ film 15 provided on the $NaNbO_3$ film 14 has high crystallinity, high orientation, and a small leak current.

The thickness of the $NaNbO_3$ film 14 is not limited. The thickness of at least several lattice units (about 2 nm) is large enough to form the $(Bi, Na, Ba)TiO_3$ film 15 having high crystallinity, high (001) orientation, and a small leak current.

The $NaNbO_3$ film 14 has a perovskite-type crystal structure represented by the chemical formula $ABO_3$. A site contains Na as its main component, and B site contains Nb as its main component. The $NaNbO_3$ film 14 may contain a minute amount of impurities. The impurities typically can be K or Li to substitute for Na.

A (001)-oriented film further may be sandwiched between the $LaNiO_3$ film 13 and the $NaNbO_3$ film 14. The (001)-oriented film is, for example, a Pt film or a $SrRuO_3$ film.

Typically, the $NaNbO_3$ film 14 can be formed by sputtering. The $NaNbO_3$ film 14 can be formed also by a thin film formation technique, such as PLD, CVD, sol-gel processing, and AD, as long as it has a (001) orientation.

According to the piezoelectric thin film manufacturing method of the present invention, the $NaNbO_3$ film 14 is formed on the $LaNiO_3$ film 13 by sputtering.

The $(Bi, Na, Ba)TiO_3$ film 15 is a film composed of $(Bi, Na,Ba)TiO_3$. The $(Bi, Na, Ba)TiO_3$ film 15 has a plane orientation of (001) on its surface.

The thickness of the $(Bi, Na, Ba)TiO_3$ film 15 is not limited. The thickness thereof is at least 0.5 μm but not more than 10 μm, for example. Although the $(Bi, Na, Ba)TiO_3$ film 15 is such a thin film, it has a low dielectric loss and high piezoelectric performance.

The $(Bi, Na, Ba)TiO_3$ film 15 has a perovskite-type crystal structure represented by the chemical formula $ABO_3$. The A site and the B site each have an average valence of 2 and 4, depending on the placement of a single element or a plurality of elements. The A site is Bi, Na, and Ba. The B site is Ti. The $(Bi, Na, Ba)TiO_3$ film 15 may contain a minute amount of impurities. The impurities typically can be Li and K to substitute for Na, and Sr and Ca to substitute for Ba, in the A site. The impurities typically can be Zr to substitute for Ti in the B site. Other examples of the impurities can be Mn, Fe, Nb, and Ta. Some of these impurities can improve the crystallinity and piezoelectric performance of the $(Bi, Na, Ba)TiO_3$ film 15.

Typically, the $(Bi, Na, Ba)TiO_3$ film 15 can be formed by sputtering. The $(Bi, Na, Ba)TiO_3$ film 15 can be formed also by another thin film formation technique, such as PLD, CVD, sol-gel processing, and AD, as long as it has a (001) orientation.

According to the piezoelectric thin film manufacturing method of the present invention, the $(Bi, Na, Ba)TiO_3$ film 15 is formed on the $NaNbO_3$ film 14 by sputtering.

Figure 1B:
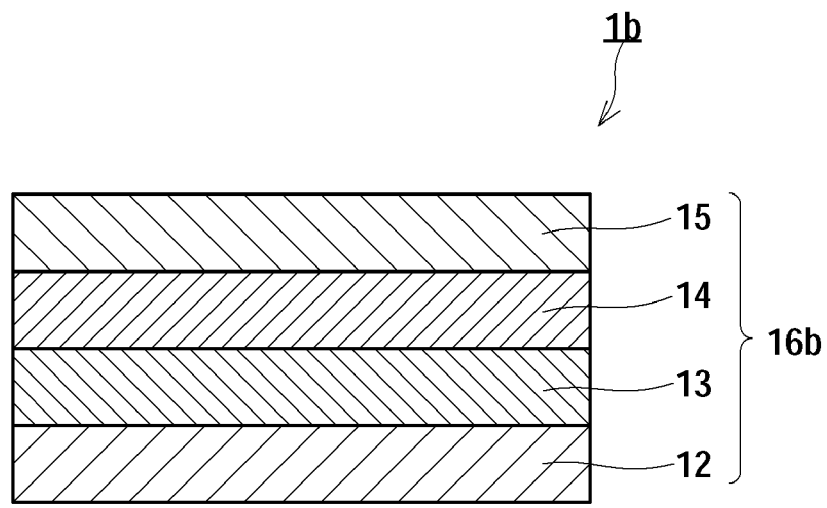
FIG. 1B is a cross-sectional view schematically showing another example of the piezoelectric thin film of the present invention.

FIG. 1B shows another embodiment of the piezoelectric thin film according to the present invention. A piezoelectric thin film $1b$ shown in FIG. 1B has a multilayer structure $16b$. In the multilayer structure $16b$, a metal electrode film 12 is added to the multilayer structure $16a$ shown in FIG. 1A. In the multilayer structure $16b$, the $LaNiO_3$ film 13 is formed on this metal electrode film 12. Specifically, the multilayer structure 16b has the metal electrode film 12, the LaNiO$_3$ film 13 having a (001) orientation, the NaNbO$_3$ film 14 having a (001) orientation, and the (Bi, Na, Ba)TiO$_3$ film 15 having a (001) orientation in this order. These films 12 to 15 are laminated in contact with each other.

Examples of the material for the metal electrode film 12 include metals such as platinum (Pt), palladium (Pd), gold (Au); and oxide conductors such as nickel oxide (NiO), ruthenium oxide (RuO$_2$), iridium oxide (IrO$_2$), and strontium ruthenate (SrRuO$_3$). The metal electrode film 12 can be composed of two or more of these materials. Preferably, the metal electrode film 12 has a low electrical resistance and a high heat resistance. Thus, the metal electrode film 12 preferably is a Pt film. The Pt film can have a (111) orientation.

That is, the piezoelectric thin film of the present invention further may include the Pt film. The LaNiO$_3$ film 13 can be formed on the Pt film.

Together with the LaNiO$_3$ film 13, the metal electrode film 12 can serve as an electrode layer for applying voltage to the (Bi, Na, Ba) TiO$_3$ film 15 that is a piezoelectric layer. In other words, the electrode layer is a laminate composed of the LaNiO$_3$ film 13 and the metal electrode film 12.

The piezoelectric thin film 1b shown in FIG. 1B can be manufactured by forming the LaNiO$_3$ film 13, the NaNbO$_3$ film 14, and the (Bi, Na, Ba)TiO$_3$ film 15 in this order on the metal electrode film 12.

According to the piezoelectric thin film manufacturing method of the present invention, the LaNiO$_3$ film 13 can be formed on the metal electrode film (preferably, the Pt film) 12. Thus, the piezoelectric thin film 1b shown in FIG. 1B can be manufactured.

Figure 1C:
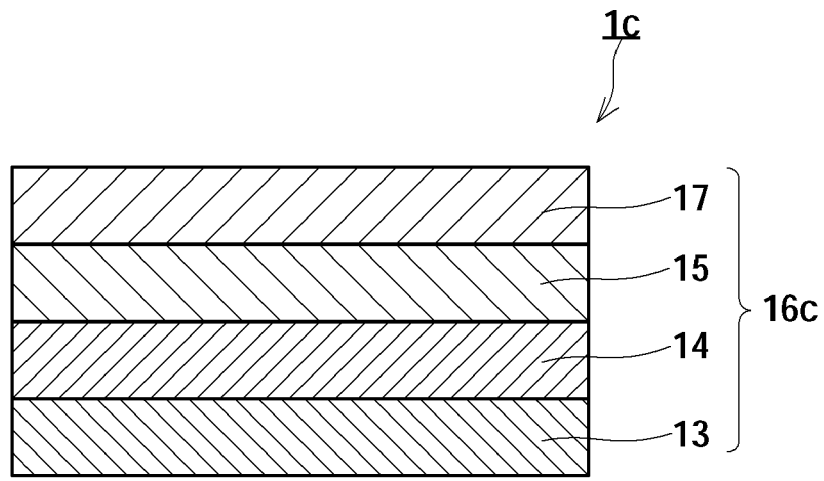
FIG. 1C is a cross-sectional view schematically showing still another example of the piezoelectric thin film of the present invention.

FIG. 1C shows still another embodiment of the piezoelectric thin film according to the present invention. A piezoelectric thin film 1c shown in FIG. 1C has a multilayer structure 16c. In the multilayer structure 16c, a conductive film 17 is added to the multilayer structure 16a shown in FIG. 1A. The conductive film 17 is formed on the (Bi, Na, Ba)TiO$_3$ film 15. Specifically, the multilayer structure 16c has the LaNiO$_3$ film 13 having a (001) orientation, the NaNbO$_3$ film 14 having a (001) orientation, the (Bi, Na, Ba)TiO$_3$ film 15 having a (001) orientation, and the conductive film 17 in this order. These films 13 to 15 and 17 are laminated in contact with each other. In the piezoelectric thin film 1c, the (Bi, Na, Ba)TiO$_3$ film 15 is sandwiched between the NaNbO$_3$ film 14 and the conductive film 17. The LaNiO$_3$ film 13 and the conductive film 17 can serve as electrode layers for applying voltage to the (Bi, Na, Ba)TiO$_3$ film 15 that is a piezoelectric layer.

The conductive film 17 is composed of a material having conductivity. Examples of the material are metal having a low electrical resistance. The material can be an oxide conductor such as NiO, RuO$_2$, IrO$_3$, SrRuO$_3$, and LaNiO$_3$. The conductive film 17 can be composed of two or more of these materials. Between the conductive film 17 and the (Bi, Na, Ba)TiO$_3$ film 15, an adhesive layer for improving the adhesion therebetween can be disposed. Examples of the material for the adhesive layer include titanium (Ti). The material can be tantalum (Ta), iron (Fe), cobalt (Co), nickel (Ni), chromium (Cr), or a compound of these. The adhesive layer can be composed of two or more of these materials. The adhesive layer can be omitted depending on the adhesion between the conductive film 17 and the (Bi, Na, Ba)TiO$_3$ film 15.

The piezoelectric thin film 1c shown in FIG. 1C can be manufactured by forming the NaNbO$_3$ film 14, the (Bi, Na, Ba)TiO$_3$ film 15, and the conductive film 17 on the LaNiO$_3$ film 13 in this order. The conductive film 17 can be formed by, for example, a thin film formation technique, such as sputtering, PLD, CVD, sol-gel processing, and AD.

The piezoelectric thin film manufacturing method of the present invention further may include a step of forming the conductive film 17 on the (Bi, Na, Ba)TiO$_3$ film 15. Thus, the piezoelectric thin film 1c shown in FIG. 1C can be manufactured.

Figure 1D:
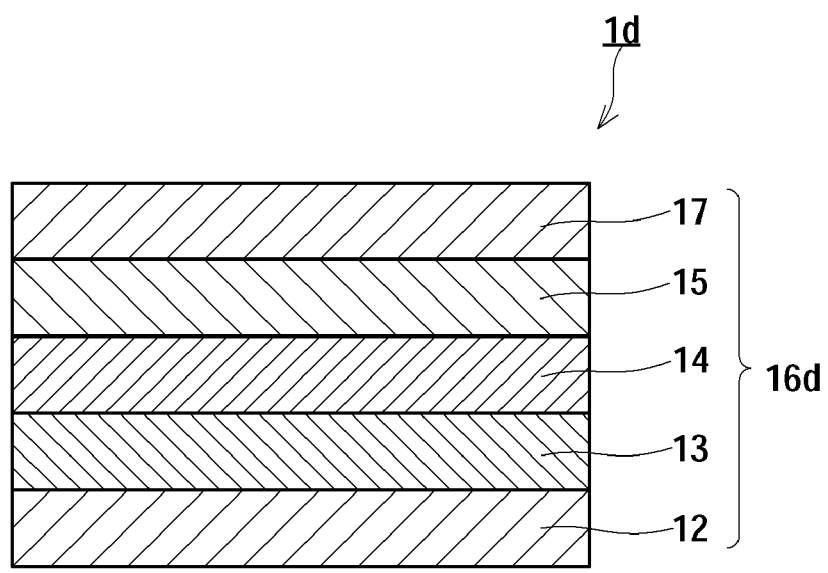
FIG. 1D is a cross-sectional view schematically showing further still another example of the piezoelectric thin film of the present invention.

FIG. 1D shows still another embodiment of the piezoelectric thin film according to the present invention. A piezoelectric thin film 1d shown in FIG. 1D has a multilayer structure 16d. In the multilayer structure 16d, the metal electrode film 12 and the conductive film 17 are further added to the multilayer structure 16a shown in FIG. 1A. In the multilayer structure 16d, the LaNiO$_3$ film 13 is formed on the metal electrode film 12. The conductive film 17 is formed on the (Bi, Na, Ba)TiO$_3$ film 15. Specifically, the multilayer structure 16d has the metal electrode film 12, the LaNiO$_3$ film 13 having a (001) orientation, the NaNbO$_3$ film 14 having a (001) orientation, the (Bi, Na, Ba)TiO$_3$ film 15 having a (001) orientation, and the conductive film 17 in this order. These films 12 to 15 and 17 are laminated in contact with each other.

Together with the LaNiO$_3$ film 13, the metal electrode film 12 included in the piezoelectric thin film 1d can serve as an electrode layer for applying voltage to the (Bi, Na, Ba)TiO$_3$ film 15 that is a piezoelectric layer. In other words, the electrode layer is a laminate composed of the LaNiO$_3$ film 13 and the metal electrode film 12. Furthermore, in the piezoelectric thin film 1d, the (Bi, Na, Ba)TiO$_3$ film 15 is sandwiched between the LaNiO$_3$ film 13 (or the electrode layer comprising the LaNiO$_3$ film 13) and the conductive film 17. The LaNiO$_3$ film (or the electrode layer comprising the LaNiO$_3$ film) and the conductive film 17 can serve as electrode layers for applying voltage to the (Bi, Na, Na)TiO$_3$ film 15 that is a piezoelectric layer.

The piezoelectric thin film 1d shown in FIG. 1D can be manufactured by forming the LaNiO$_3$ film 13, the NaNbO$_3$ film 14, the (Bi, Na, Ba)TiO$_3$ film 15, and the conductive film 17 in this order on the metal electrode film 12.

The piezoelectric thin film manufacturing method of the present invention can include a step of forming the LaNiO$_3$ film 13 on the metal electrode film (preferably, the Pt film) 12. The method further may include a step of forming the conductive film 17 on the (Bi, Na, Ba)TiO$_3$ film 15. Thus, the piezoelectric thin film 1d shown in FIG. 1D can be manufactured.

Figure 1E:
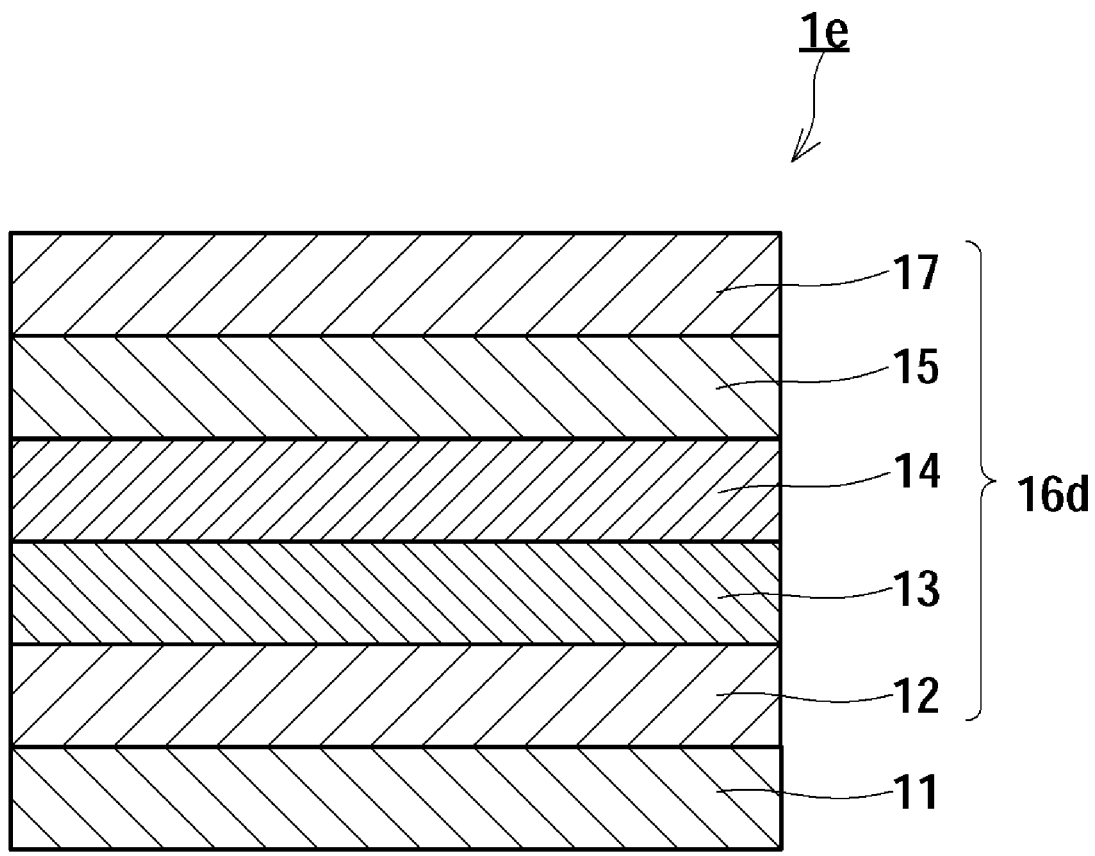
FIG. 1E is a cross-sectional view schematically showing further still another example of the piezoelectric thin film of the present invention.

As shown in FIG. 1E, the piezoelectric thin film of the present invention further may include a substrate 11. The LaNiO$_3$ film 13 is formed on the substrate. The LaNiO$_3$ film 13 is sandwiched between the substrate 11 and the NaNbO$_3$ film 14.

In the piezoelectric thin film 1e shown in FIG. 1E, the multilayer structure 16d shown in FIG. 1D is formed on the substrate 11.

The substrate 11 can be a silicon (Si) substrate. Preferably, the substrate 11 is a monocrystalline Si substrate.

Between the substrate 11 and the multilayer structure 16d (Specifically, between the substrate 11 and the LaNiO$_3$ film 13), an adhesive layer for improving the adhesion therebetween can be disposed. The adhesive layer needs to have conductivity. Examples of the material for the adhesive layer include Ti. The material can be Ta, Fe, Co, Ni, Cr, or a compound of these. The adhesive layer can be composed of two or more of these materials. The adhesive layer can be omitted depending on the adhesion between the substrate 11 and the multilayer structure 16d.

The piezoelectric thin film 1e shown in FIG. 1E can be manufactured by forming the metal electrode film (preferably, the Pt film) 12, the LaNiO$_3$ film 13, the NaNbO$_3$ film 14, the (Bi, Na, Ba)TiO$_3$ film 15, and the conductive film 17 in this order on the substrate 11.

The piezoelectric thin film manufacturing method of the present invention can include a step of forming the LaNiO$_3$ film 13 on the substrate 11.

The piezoelectric thin films 1a to 1d shown in FIG. 1A to FIG. 1D each can be manufactured using a base substrate. Specifically, these piezoelectric thin films 1a to 1d can be manufactured by forming the multilayer structures 16a to 16d on the base substrate, respectively, and then removing the base substrate. The base substrate can be removed by a well-known technique such as etching.

The piezoelectric thin film 1e shown in FIG. 1E also can be manufactured using a base substrate. In another specific embodiment in which the base substrate doubles as the substrate 11, the piezoelectric thin film 1e can be manufactured by forming the multilayer structure 16d on the base substrate, then removing the base substrate, and furthermore disposing the multilayer structure 16d on the substrate 11 prepared separately.

The base substrate can be one of the following substrates: a substrate made of an oxide having a NaCl structure, such as MgO; a substrate made of an oxide having a perovskite structure, such as SrTiO$_3$, LaAlO$_3$, and NdGaO$_3$; a substrate made of an oxide having a corundum structure, such as Al$_2$O$_3$; a substrate made of an oxide having a spinel structure, such as MgAl$_2$O$_4$; a substrate made of an oxide having a rutile structure, such as TiO$_2$; and a substrate made of an oxide having a cubic crystal structure, such as (La,Sr)(Al,Ta)O$_3$, and yttria-stabilized zirconia (YSZ). The base substrate can be formed by laminating an oxide thin film having a NaCl type crystal structure on the surface of a glass substrate, a ceramic substrate such as an alumina substrate, or a metal substrate such as a stainless steel substrate. In this case, the metal electrode film 12 or the LaNiO$_3$ film 13 can be formed on the surface of the oxide thin film. Examples of the oxide thin film include a MgO thin film, a nickel oxide (NiO) thin film, and a cobalt oxide (CoO) thin film.

The piezoelectric thin film manufacturing method of the present invention may include a step of forming the LaNiO$_3$ film 13 on the base substrate directly or via another film such as the metal electrode film 12, as described above. The base substrate can double as the substrate 11. Another substrate can be disposed after the base substrate is removed. In this case, the another substrate can be disposed in contact with the metal electrode film 12 or the LaNiO$_3$ film 13. Or the another substrate can be disposed in contact with the (Bi, Na, Ba)TiO$_3$ film 15. In the latter case, it is possible to obtain the piezoelectric thin film in which the (Bi, Na, Ba)TiO$_3$ film 15, the NaNbO$_3$ film 14, and the LaNiO$_3$ film 13 are laminated in this order on the another substrate.

[Ink Jet Head]

Hereinafter, an ink jet head of the present invention will be described with reference to FIG. 2 to FIG. 12B.

Figure 2:
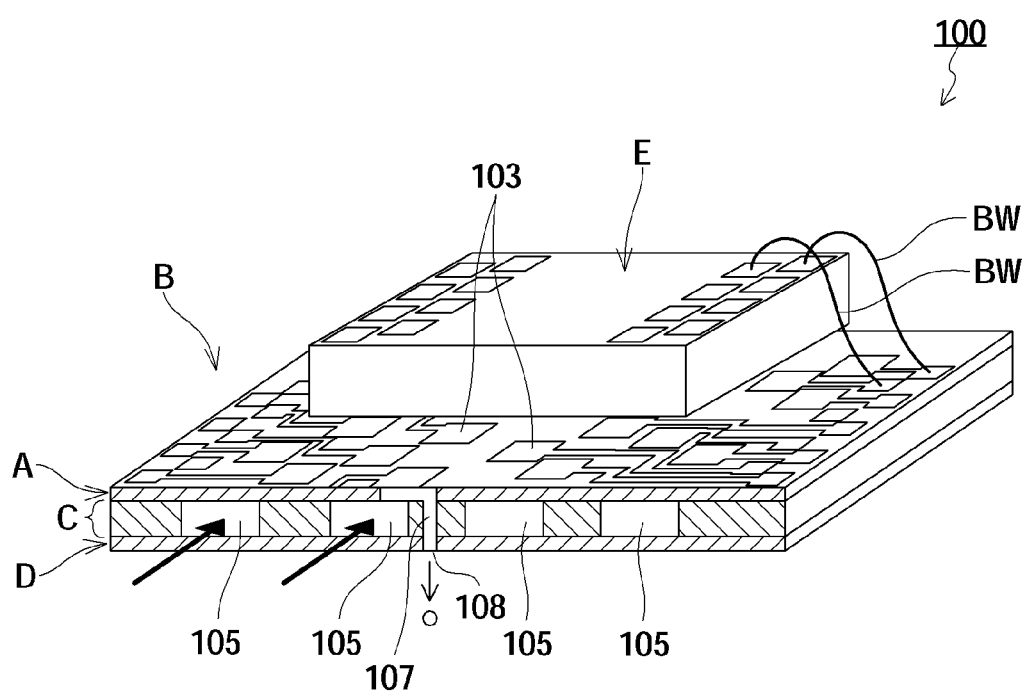
FIG. 2 is a perspective view schematically showing an example of an ink jet head of the present invention and partially showing a cross section of the ink jet head.
Figure 3:
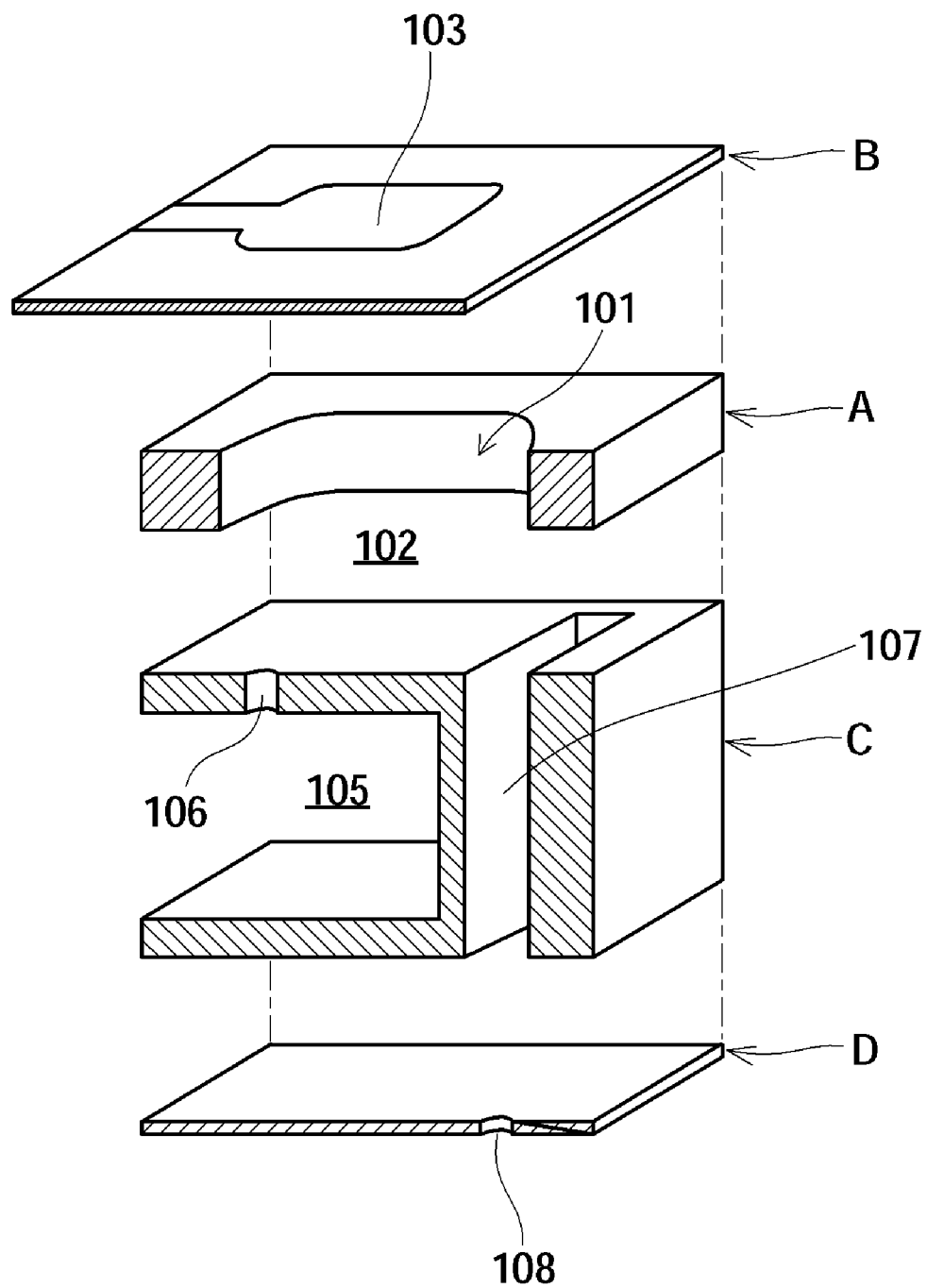
FIG. 3 is an exploded perspective view schematically showing main parts including a pressure chamber member and an actuator part in the ink jet head shown in FIG. 2 and partially showing a cross section of the main parts.

FIG. 2 shows one embodiment of the ink jet head of the present invention. FIG. 3 is an exploded view showing main parts including a pressure chamber member and an actuator part in an ink jet head 100 shown in FIG. 2.

A reference character A in FIG. 2 and FIG. 3 indicates a pressure chamber member. The pressure chamber member A comprises through-holes that penetrate therethrough in its thickness direction (in the upward and downward directions in these diagrams). Apart of the through-hole is shown in FIG. 3 as the through-hole 101, which is a cross section of the through-hole cut in the thickness direction of the pressure chamber member A. A reference character B indicates an actuator part comprising piezoelectric thin films and vibration layers. A reference character C indicates an ink passage member C comprising common liquid chambers 105 and ink passages 107. The pressure chamber member A, the actuator part B, and the ink passage member C are bonded to each other so that the pressure chamber member A is sandwiched between the actuator part B and the ink passage member C. When the pressure chamber member A, the actuator part B, and the ink passage member C are bonded to each other, each of the through-holes 101 forms a pressure chamber 102 for storing ink supplied from the common liquid chamber 105.

The piezoelectric thin films and the vibration layers comprised in the actuator part B are aligned over the corresponding pressure chambers 102 in plan view. In FIG. 2 and FIG. 3, a reference numeral 103 indicates an individual electrode layer that is a part of the piezoelectric thin film. As shown in FIG. 2, the ink jet head 100 comprises at least two individual electrode layers 103, that is, at least two piezoelectric thin films, arranged in a zigzag pattern in plan view.

The ink passage member C comprises at least two common liquid chambers 105 arranged in stripes in plan view. One common liquid chamber 105 is aligned over at least two pressure chambers 102 in plan view. The common liquid chambers 105 extend in the ink supply direction (in the direction indicated by arrows in FIG. 2) in the ink jet head 100. The ink passage member C comprises supply ports 106, each of which supplies the ink in the common liquid chamber 105 to one of the pressure chambers 102, and ink passages 107, each of which ejects the ink in the pressure chamber 102 through the corresponding nozzle hole 108. Usually, one pressure chamber 102 has one supply port 106 and one nozzle hole 108. The nozzle holes 108 are formed in a nozzle plate D. The nozzle plate D is bonded to the ink passage member C so that the nozzle plate D and the pressure chamber member A sandwich the ink passage member C therebetween.

In FIG. 2, a reference character E indicates an IC chip. The IC chip E is connected electrically to the individual electrode layers 103, which are exposed on the surface of the actuator part B, through bonding wires BW. For simplicity of FIG. 2, only a part of the bonding wires BW are shown in FIG. 2.

Figure 4A:
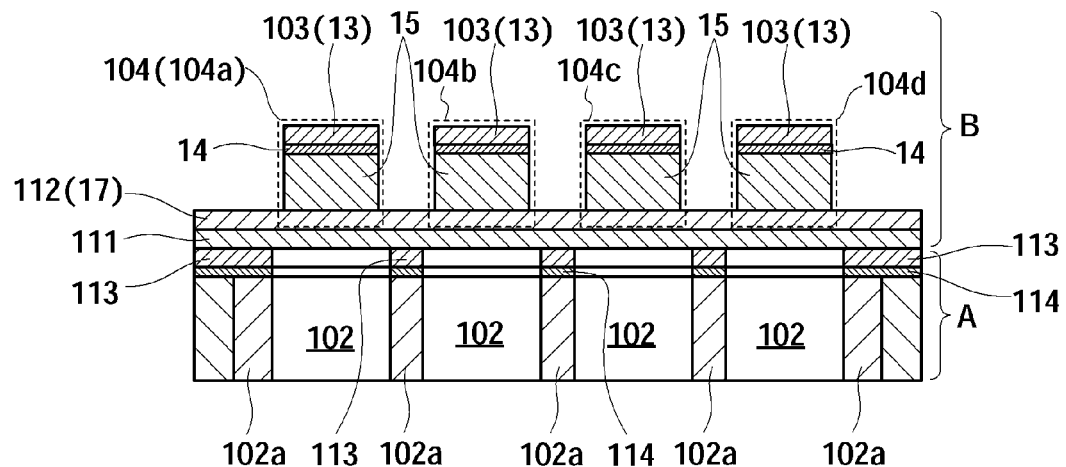
FIG. 4A is a cross-sectional view schematically showing an example of the main parts including the pressure chamber member and the actuator part in the ink jet head shown in FIG. 2.
Figure 4B:
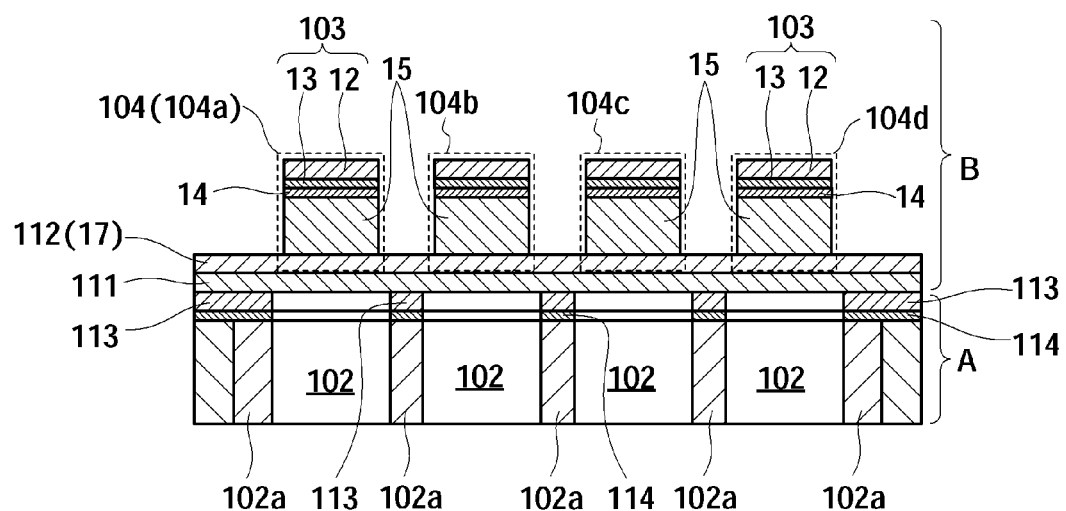
FIG. 4B is a cross-sectional view schematically showing another example of the main parts including the pressure chamber member and the actuator part in the ink jet head shown in FIG. 2.

FIG. 4A and FIG. 4B show the configuration of the main parts including the pressure chamber member A and the actuator part B. FIG. 4A and FIG. 4B show the cross section perpendicular to the ink supply direction (the direction indicated by the arrows in FIG. 2) in the pressure chamber member A and the actuator part B. The actuator part B comprises piezoelectric thin films 104 (104a to 104d) each having the piezoelectric layer 15 sandwiched between a first electrode (the individual electrode layer 103) and a second electrode (a common electrode layer 112). The individual electrode layers 103 correspond one to one to the piezoelectric thin films 104a to 104d. The common electrode layer 112 is an electrode that is common to the piezoelectric thin films 104a to 104d.

The piezoelectric thin film 104 shown in FIG. 4A has the multilayer structure 16c shown in FIG. 1C. This structure comprises the LaNiO$_3$ film 13 that is the individual electrode layer 103, the NaNbO$_3$ film 14, the (Bi, Na, Ba)TiO$_3$ film 15 that is a piezoelectric layer, and the conductive film 17 that is the common electrode layer 112 in this order from the side of the LaNiO$_3$ film 13.

The piezoelectric thin film 104 shown in FIG. 4B has the multilayer structure 16d shown in FIG. 1D. This structure includes the metal electrode film (preferably, the Pt film) 12 and the LaNiO$_3$ film 13 that serve as the individual electrode layer 103, the NaNbO$_3$ film 14, the (Bi, Na, Ba)TiO$_3$ film 15 that is a piezoelectric layer, and the conductive film 17 that is the common electrode layer 112, in this order from the side of the metal electrode film 12. The LaNiO$_3$ film 13 is formed on the metal electrode film 12.

The metal electrode film 12, the LaNiO$_3$ film 13, the NaNbO$_3$ film 14, the (Bi, Na, Ba)TiO$_3$ film 15, and the conductive film 17 in each of the piezoelectric thin films 104 shown in FIG. 4A and FIG. 4B are the same as those in the piezoelectric thin film of the present invention that has been described above, including the preferred embodiments thereof.

The conductive film 17 that is the common electrode layer 112 can be a Pt film having, on its surface, an adhesive layer made of a conductive material. Preferably, the conductive material is Ti. This is because Ti has high adhesion to the (Bi, Na, Ba)TiO$_3$ film 15 and can serve satisfactorily as an adhesive layer between the piezoelectric layer and the common electrode layer.

Either of the first electrode and the second electrode can be the individual electrode layer as long as a voltage applied between the first electrode and the second electrode can induce a deformation of the piezoelectric layer 15. That is, the piezoelectric thin film in the ink jet head of the present invention can comprise the common electrode layer 112, the NaNbO$_3$ film 14, the (Bi, Na, Ba)TiO$_3$ film 15 that is a piezoelectric layer, and the individual electrode layer 103 in this order. In this case, the common electrode layer 112 that is the first electrode is composed of the LaNiO$_3$ film 13. Alternatively, the common electrode layer 112 is composed of a laminate of the LaNiO$_3$ film 13 and the metal electrode film 12, and in the piezoelectric thin film, the LaNiO$_3$ film 13 is disposed in contact with the NaNbO$_3$ film 14. The individual electrode layer 103 is composed of the conductive film 17.

Preferably, the individual electrode layer 103 has a thickness of at least 0.05 μm but not more than 1 μm. When the individual electrode layer 103 is a laminate of the metal electrode film 12 and the LaNiO$_3$ film 13, it is preferable that the LaNiO$_3$ film 13 have a thickness of at least 0.05 μm but not more than 0.5 μm. Preferably, the NaNbO$_3$ film 14 has a thickness of at least 0.05 μm but not more than 0.5 μm. Preferably, the (Bi, Na, Ba)TiO$_3$ film 15 has a thickness of at least 0.5 μm but not more than 5 μm. Preferably, the common electrode layer 112 has a thickness of at least 0.05 μm but not more than 0.5 μm.

The actuator part B further comprises a vibration layer 111. The vibration layer 111 is bonded to the common electrode layer 112 of the piezoelectric thin film 104. The vibration layer 111 is displaced in its film thickness direction according to a deformation of the piezoelectric thin film 104 produced by a piezoelectric effect. A voltage application to the piezoelectric layer 15 through the individual electrode layer 103 and the common electrode layer 112 brings about a deformation of the piezoelectric thin film 104 produced by the piezoelectric effect.

The pressure chamber member A is bonded to the vibration layer 111 via an intermediate layer 113 and an adhesive layer 114. The pressure chamber member A and the piezoelectric thin film 104 sandwich the vibration layer 111 therebetween.

The configuration of the vibration layer 111, the bonding state of the piezoelectric thin film 104 and the vibration layer 111, and the bonding state of the vibration layer 111 and the pressure chamber member A are not limited as long as: (1) the vibration layer 111 is displaced according to a deformation of the piezoelectric thin film 104 produced by the piezoelectric effect; (2) the volumetric capacity of the pressure chamber 102 changes according to the displacement of the vibration layer 111; and (3) the ink in the pressure chamber 102 can be ejected according to the change in the volumetric capacity of the pressure chamber 102. In FIG. 4A and FIG. 4B, the vibration layer 111 forms a wall of the pressure chamber 102.

The material composing the vibration layer 111 is, for example, Cr. The material can be Ni, aluminum (Al), Ta, tungsten (W), or silicon, or an oxide or nitride of these elements (for example, silicon dioxide, aluminum oxide, zirconium oxide, or silicon nitride). Preferably, the vibration layer 111 has a thickness of at least 2 μm but not more than 5 μm.

The material composing the adhesive layer 114 is, for example, an adhesive or a glue. A person skilled in the art can select an appropriate type of adhesive or glue.

The intermediate layer (longitudinal wall) 113 prevents the adhesive layer 114 from adhering to a portion of the vibration layer 111 exposed to the pressure chamber 102 when the pressure chamber member A is bonded to the vibration layer 111 via the adhesive layer 114. The adhesive that has adhered to the portion inhibits the displacement of the vibration layer 111. The material composing the intermediate layer 113 is not limited as long as the functions of the ink jet head 100 are maintained. The material of the intermediate layer 113 is, for example, Ti. The intermediate layer 113 can be omitted.

The pressure chamber member A has partition walls 102a between adjacent pressure chambers 102.

An example of the method of manufacturing the ink jet head 100 shown in FIG. 2 is described with reference to FIG. 5A to FIG. 10.

Figure 5A:
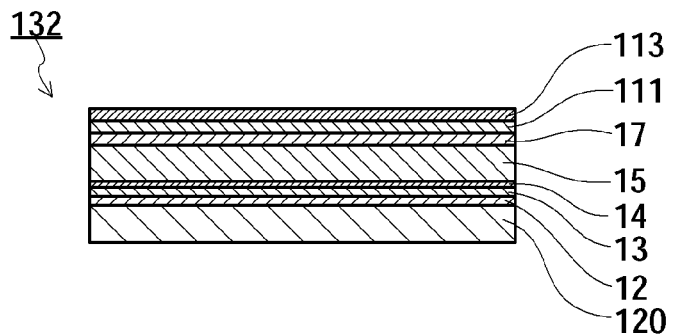
FIG. 5A is a cross-sectional view schematically showing a step of forming a laminate including a piezoelectric layer in an example of a method of manufacturing the ink jet head shown in FIG. 2.

First, as shown in FIG. 5A, the metal electrode film (preferably, the Pt film) 12, the LaNiO$_3$ film 13, the NaNbO$_3$ film (the interface layer) 14, the (Bi, Na, Ba)TiO$_3$ film (the piezoelectric layer) 15, the conductive film 17, the vibration layer 111, and the intermediate layer 113 are formed in this order on the base substrate 120 to obtain a laminate 132. A thin film formation technique for forming the respective layers and films is not particularly limited. Examples of the thin film formation technique include PLD, CVD, sol-gel processing, AD, and sputtering. Sputtering is preferably used as the technique.

Figure 5B:
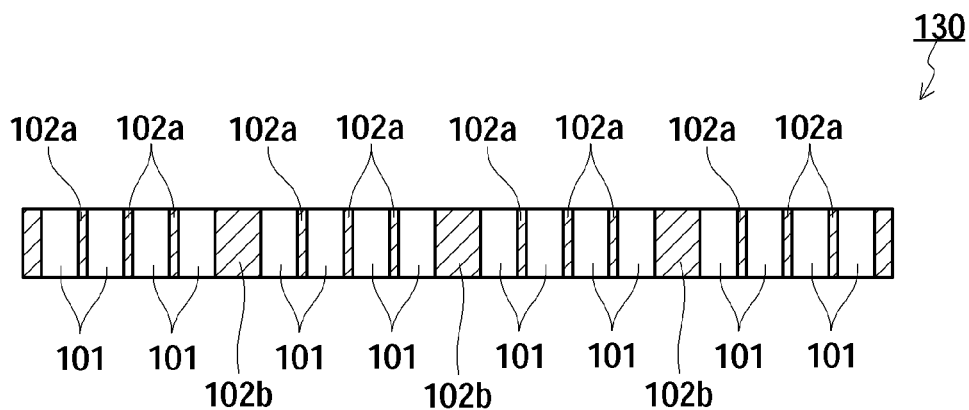
FIG. 5B is a cross-sectional view schematically showing a step of forming a member, which serves as the pressure chamber member later, in the example of the method of manufacturing the ink jet head shown in FIG. 2.
Figure 10:
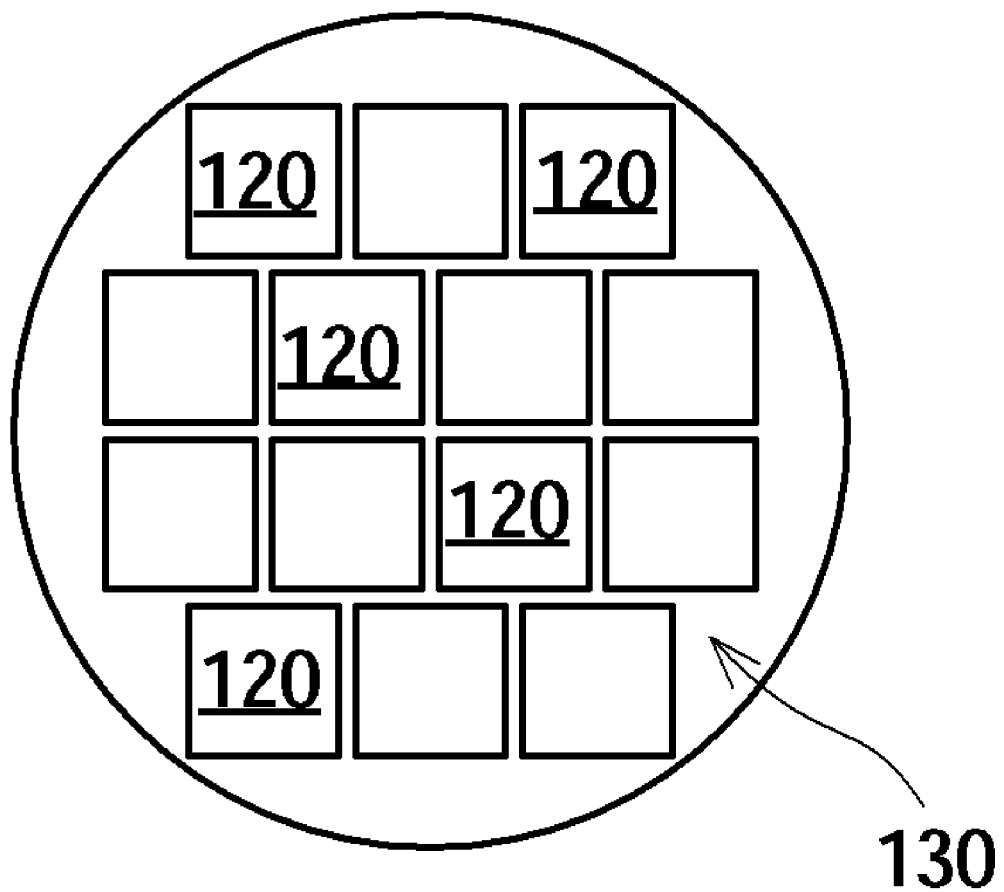
FIG. 10 is a plan view schematically showing an example of an arrangement in which a laminate serving later as the actuator part is placed on a substrate serving later as the pressure chamber member.

Apart from the formation of the laminate 132, a member, which serves as the pressure chamber member A later, is formed. This member can be formed, for example, by microfabricating a Si substrate (preferably, a monocrystalline Si substrate). It is preferable that the Si substrate be larger in size than the base substrate 120 (See FIG. 10. In FIG. 10, a reference character 130 indicates an Si substrate. The reference numeral 130 can be a substrate other than the Si substrate.) More specifically, as shown in FIG. 5B, a plurality of through-holes 101 are formed in the substrate 130. The through-holes 101 serve as the pressure chambers 102 after this member is bonded to the separately formed actuator part and ink passage member. In FIG. 5B, one through-hole group consists of four through-holes 101. The substrate 130 comprises a plurality of the through-hole groups. A first partition wall 102a is a partition of adjacent two through-holes 101 belonging to one through-hole group. A second partition wall 102b is a partition of adjacent two through-hole groups. Preferably, the thickness of the second partition wall 102b is at least twice as large as that of the first partition wall 102a. The through-hole 101 can be provided in the substrate 130 by a well-known microfabrication technique. The technique can be a combination of, for example, patterning and etching. The etching can be chemical etching or dry etching. The shape of the through-hole 101 can be conformed to a desired shape of the pressure chamber 102. Hereinafter, the first partition walls 102a and the second partition walls 102b are referred to as partition walls 102 collectively.

Figure 5C:
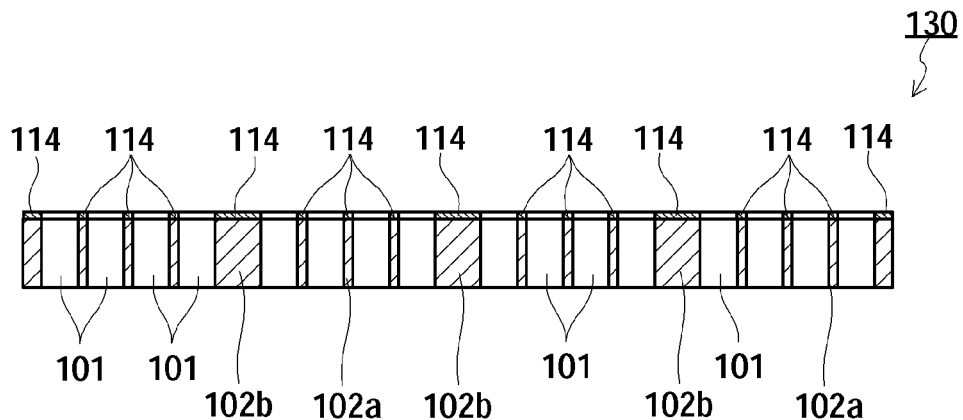
FIG. 5C is a cross-sectional view schematically showing a step of forming an adhesive layer in the example of the method of manufacturing the ink jet head shown in FIG. 2.

Next, as shown in FIG. 5C, the adhesive layer 114 is formed on the partition wall 102. The formation method of the adhesive layer 114 is not limited. An example of the method can be electrodeposition.

Figure 6A:
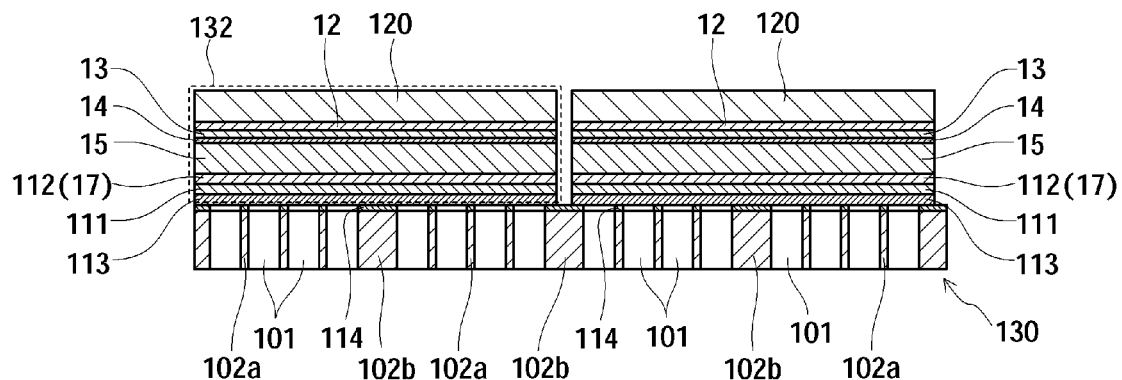
FIG. 6A is a cross-sectional view schematically showing a step of bonding the laminate formed in the step shown in FIG. 5A and the member formed in the step shown in FIG. 5B, in the example of the method of manufacturing the ink jet head shown in FIG. 2.

Then, as shown in FIG. 6A, the substrate 130 is bonded to the laminate 132. This bonding allows the intermediate layer 113 to be sandwiched between the substrate 130 and the laminate 132. As shown in FIG. 10, when the substrate 130 is larger in size than the base substrate 120, a plurality of the laminates 132 (14 laminates in the example shown in FIG. 10. In FIG. 10, the base substrates 120 of the laminates 132 are visible.) can be bonded to the substrate 130. In FIG. 6A, two laminates 132 are bonded to the substrate 130. In FIG. 6A, the center of each of the two laminates 132 is positioned on the extension of the second partition wall 102b. Bonding the substrate 130 to the laminate 132 allows the conductive film 17 to serve as the common electrode layer 112.

When the adhesive layer 114 is composed of a thermosetting adhesive, it is preferable that after the substrate 130 is bonded to the laminate 132, heat be applied to cure the adhesive layer 114 completely. The adhesive layer 114 that has spread into the through-hole 101 during the bonding can be removed by plasma treatment.

Figure 6B:
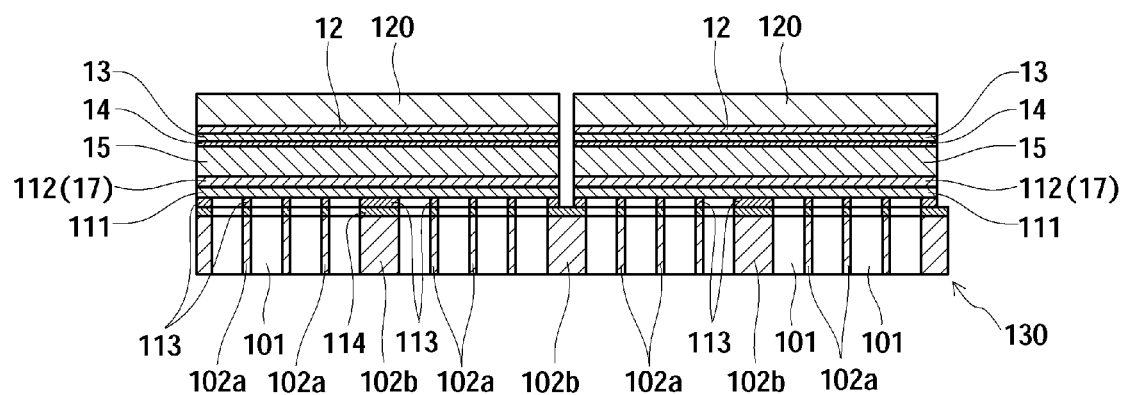
FIG. 6B is a cross-sectional view schematically showing a step (a step of etching an intermediate layer) following the step shown in FIG. 6A in the example of the method of manufacturing the ink jet head shown in FIG. 2.

Next, as shown in FIG. 6B, the intermediate layer 113 is etched by using the partition walls 102 as a mask. The etching of the intermediate layer 113 is performed in accordance with the cross-sectional shape of the through-holes 101. Thus, the vibration layer 111 is exposed to the through-holes 101. This etching transforms the shape of the intermediate layer 113 into the same shape as the partition walls 102 in plan view. The intermediate layer 113 as well as the partition wall 102 and the adhesion layer 114 compose a longitudinal wall. In this manner, the pressure chamber member A comprising the substrate 130, the intermediate layer 113, and the adhesive layer 114 is formed.

In the example shown in FIG. 5B to FIG. 6B, the substrate 130 in which the through-holes 101 are formed is bonded to the laminates 132 including the piezoelectric layers 15. The pressure chamber member A also can be formed, instead of the above procedure, by bonding the substrate 130 comprising no through-hole 101 to the laminates 132 and then forming the through-holes 101 in the substrate 130 to expose the vibration layer 111.

Figure 7A:
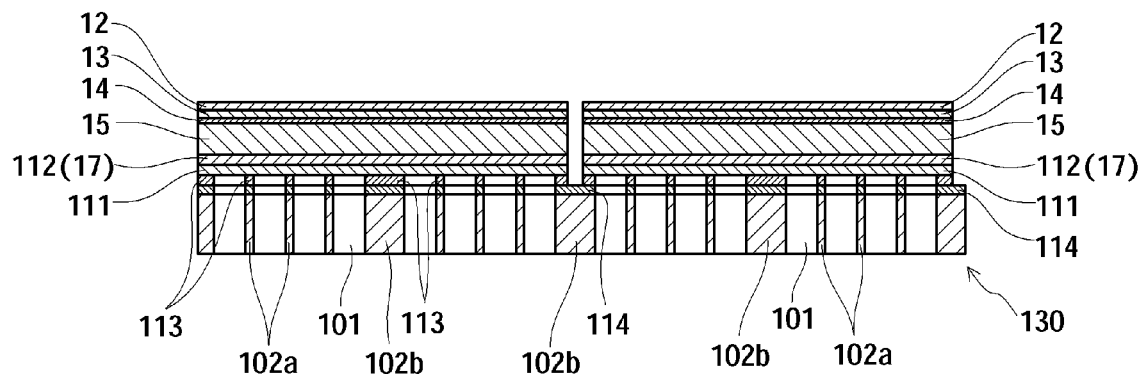
FIG. 7A is a cross-sectional view schematically showing a step (a step of removing a base substrate) following the step shown in FIG. 6B in the example of the method of manufacturing the ink jet head shown in FIG. 2.

Then, as shown in FIG. 7A, the base substrate 120 is removed by, for example, etching.

Figure 7B:
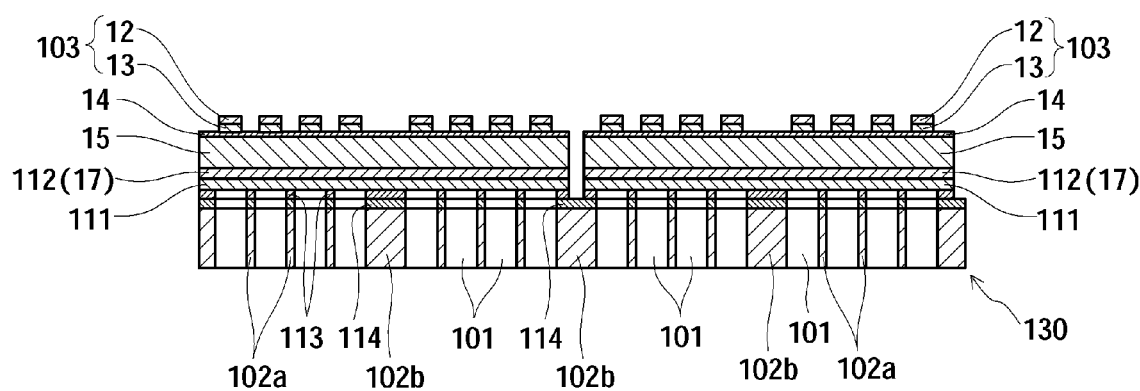
FIG. 7B is a cross-sectional view schematically showing a step (a step of forming an individual electrode layer) following the step shown in FIG. 7A in the example of the method of manufacturing the ink jet head shown in FIG. 2.

Next, as shown in FIG. 7B, the metal electrode film 12 and the $LaNiO_3$ film 13 are transformed into at least two individual electrode layers 103 by microfabrication combined of photolithography and etching. The individual electrode layers 103 correspond one to one to the through-holes 101 in plan view.

Figure 8A:
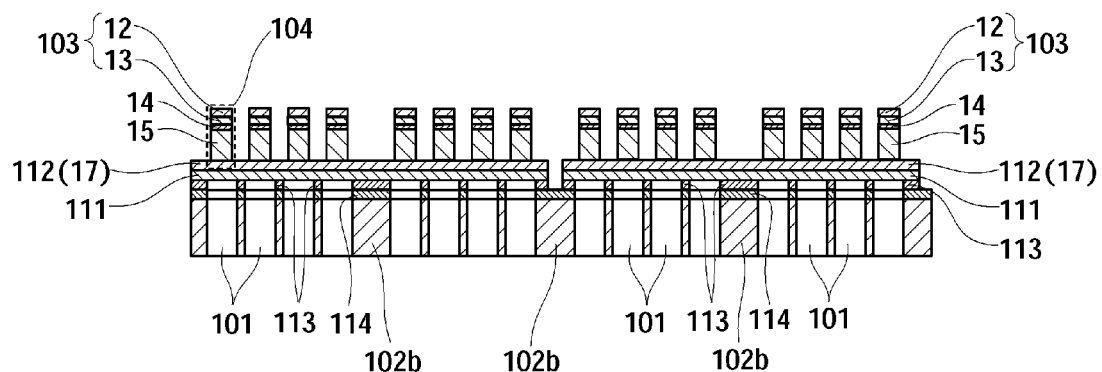
FIG. 8A is a cross-sectional view schematically showing a step (a step of microfabricating the piezoelectric layer) following the step shown in FIG. 7B in the example of the method of manufacturing the ink jet head shown in FIG. 2.

Then, as shown in FIG. 8A, the $NaNbO_3$ film 14 and the $(Bi, Na, Ba)TiO_3$ film 15 are subject to microfabrication. Both of the microfabricated $NaNbO_3$ film 14 and $(Bi, Na, Ba)TiO_3$ film 15 have the same shape as the individual electrode layer 103 in plan view. It is preferable that in this microfabrication, the center of the respective layers and films coincide with the center of the corresponding through-hole 101 with high accuracy in plan view. In this manner, the actuator part B including the vibration layers 111, and the piezoelectric thin films 104 each composed of the individual electrode layer 103 (the metal electrode film 12 and the $LaNiO_3$ film 13), the $NaNbO_3$ film 14, the $(Bi, Na, Ba)TiO_3$ film 15, and the common electrode layer 112 (the conductive film 17) is formed.

Figure 8B:
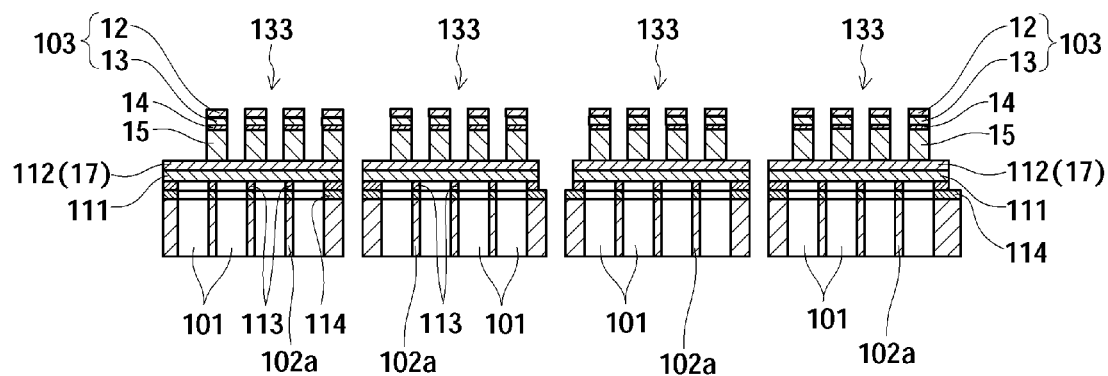
FIG. 8B is a cross-sectional view schematically showing a step (a step of cutting the substrate) following the step shown in FIG. 8A in the example of the method of manufacturing the ink jet head shown in FIG. 2.

Next, as shown in FIG. 8B, the common electrode layers 112, the vibration layers 111, and the substrate 130 are cut along the respective second partition walls 102b to obtain at least two members 133. Each of the members 133 comprises the actuator part B, and the pressure chamber member A having at least two through-holes 101. The actuator part B is bonded to the pressure chamber member A.

Figure 9A:
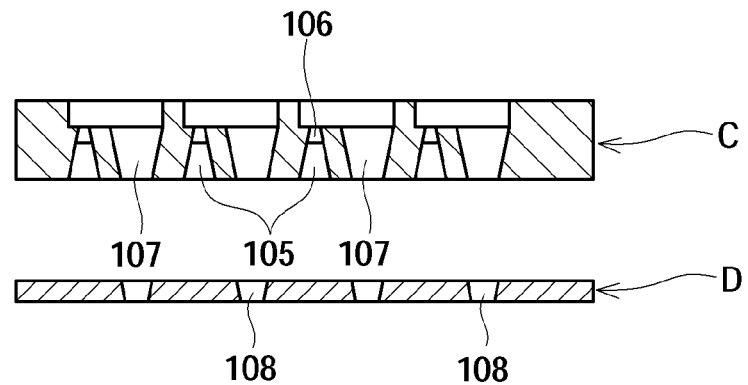
FIG. 9A is a cross-sectional view schematically showing a step of preparing an ink passage member and a nozzle plate in the example of the method of manufacturing the ink jet head shown in FIG. 2.

Apart from the above-mentioned processes, as shown in FIG. 9A, the ink passage member C comprising the common liquid chambers 105, the supply ports 106, and the ink passages 107, and the nozzle plate D comprising the nozzle holes 108 are prepared.

Figure 9B:
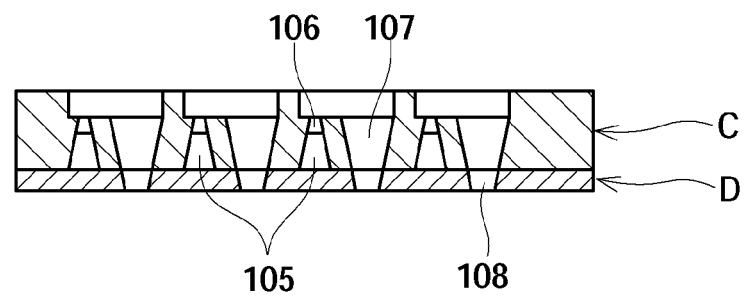
FIG. 9B is a cross-sectional view schematically showing a step of bonding the ink passage member and the nozzle plate in the example of the method of manufacturing the ink jet head shown in FIG. 2.

Next, as shown in FIG. 9B, the ink passage member C is bonded to the nozzle plate D so that the ink passages 107 are aligned over the corresponding nozzle holes 108 when viewed from the direction perpendicular to the main surface of the ink passage member C. Thus, a combined member is obtained. Preferably, the entire nozzle hole 108 is exposed in the ink passage 107. The method of bonding these two members is not limited, and for example, an adhesive is used.

Figure 9C:
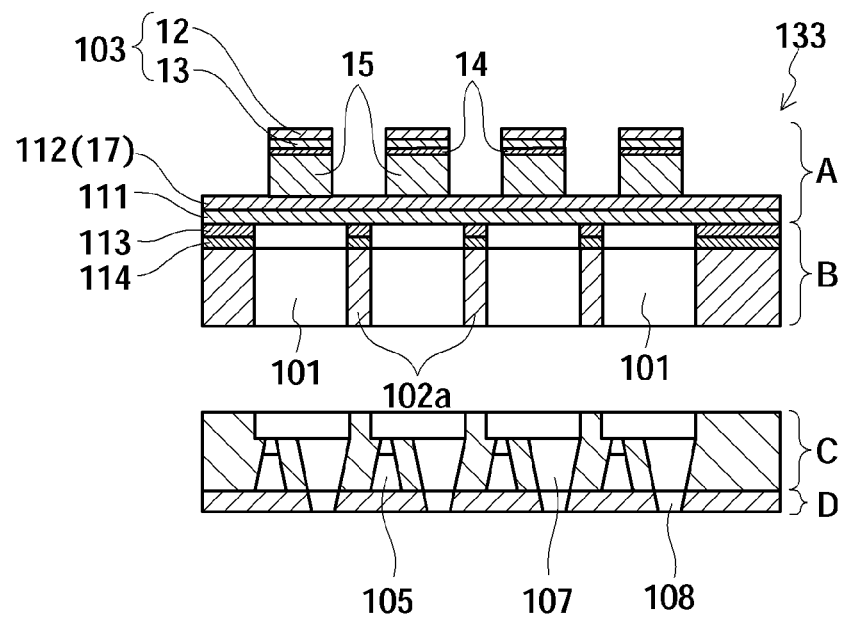
FIG. 9C is a cross-sectional view schematically showing a step of bonding a combined member of the actuator part and the pressure chamber member, and a combined member of the ink passage member and the nozzle plate in the example of the method of manufacturing the ink jet head shown in FIG. 2.

Then, as shown in FIG. 9C, the member 133 is bonded to the combined member prepared in the step shown in FIG. 9B. More specifically, the surface of the pressure chamber member A opposite to the actuator part B is bonded to the surface of the ink passage member C opposite to the nozzle plate D. When they are bonded, their alignment is adjusted so that this bonding allows the through-holes 101 to serve as the pressure chambers 102. The bonding method is not limited, and for example, an adhesive is used. In this manner, the ink jet head 100 shown in FIG. 9D (FIG. 2) is obtained.

A person skilled in the art can apply the method shown in FIG. 5A to FIG. 10 to the manufacture of an ink jet head including the piezoelectric thin film 104 comprising no metal electrode film 12.

Figure 11:
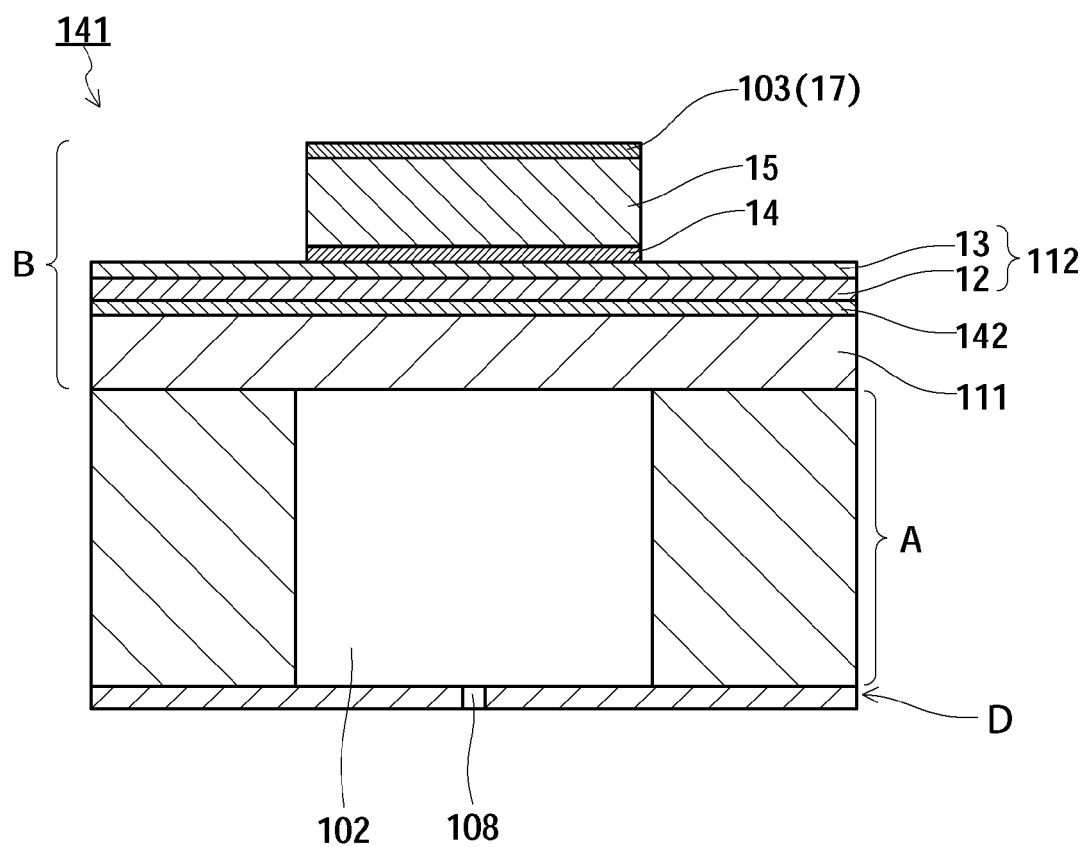
FIG. 11 is a cross-sectional view schematically showing another example of the ink jet head of the present invention.

FIG. 11 shows another ink jet head of the present invention. An ink jet head 141 shown in FIG. 11 has a simpler structure than the ink jet head 100 shown in FIG. 2 to FIG. 4. Specifically, the ink passage member C is removed from the ink jet head 100.

The ink jet head 141 shown in FIG. 11 is the same as the ink jet head 100 shown in FIG. 2 to FIG. 4 except the following points (1) to (6): (1) the ink passage member C is not included, and the nozzle plate D comprising the nozzle holes 108 is bonded directly to the pressure chamber member A; (2) the intermediate layer 113 is not included, and the vibration layer 111 is bonded directly to the pressure chamber member A; (3) an adhesive layer 142 is disposed between the vibration layer 111 and the common electrode layer 112 to improve the adhesion therebetween; (4) the common electrode layer 112 is a laminate of the metal electrode film 12 and the $LaNiO_3$ film 13; (5) the individual electrode layer 103 is the conductive film 17; and (6) the common electrode layer 112 (the metal electrode film 12 and the $LaNiO_3$ film 13), the $NaNbO_3$ film 14, the $(Bi, Na, Ba)TiO_3$ film 15, and the individual electrode layer 103 (the conductive film 17) are laminated in this order from the side of the common electrode layer 112.

The common electrode layer 112 serves as the first electrode. The individual electrode layer 103 serves as the second electrode. The material composing the adhesive layer 142 is, for example, Ti.

Figure 12A:
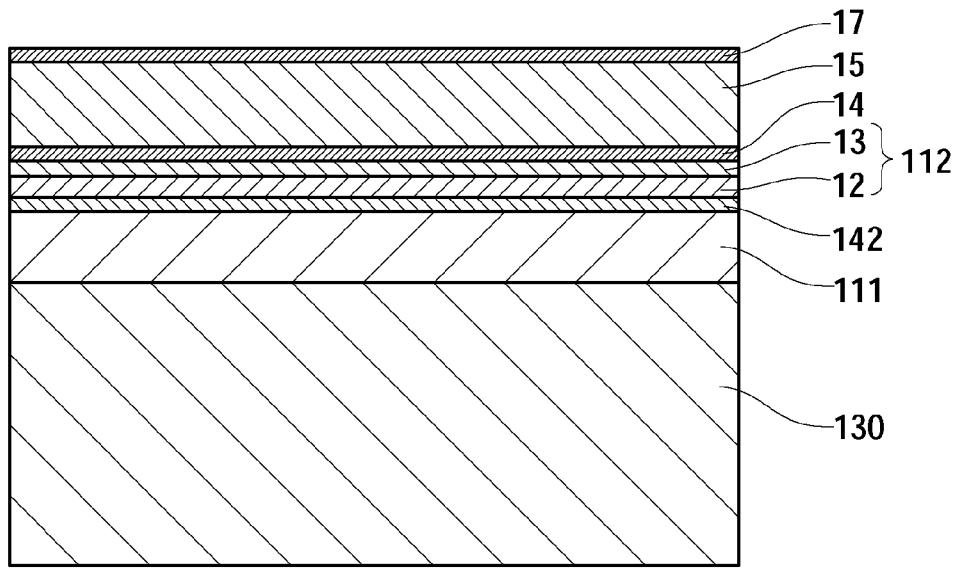
FIG. 12A is a schematic cross-sectional view for explaining the example of the method of manufacturing the ink jet head shown in FIG. 11.
Figure 12B:
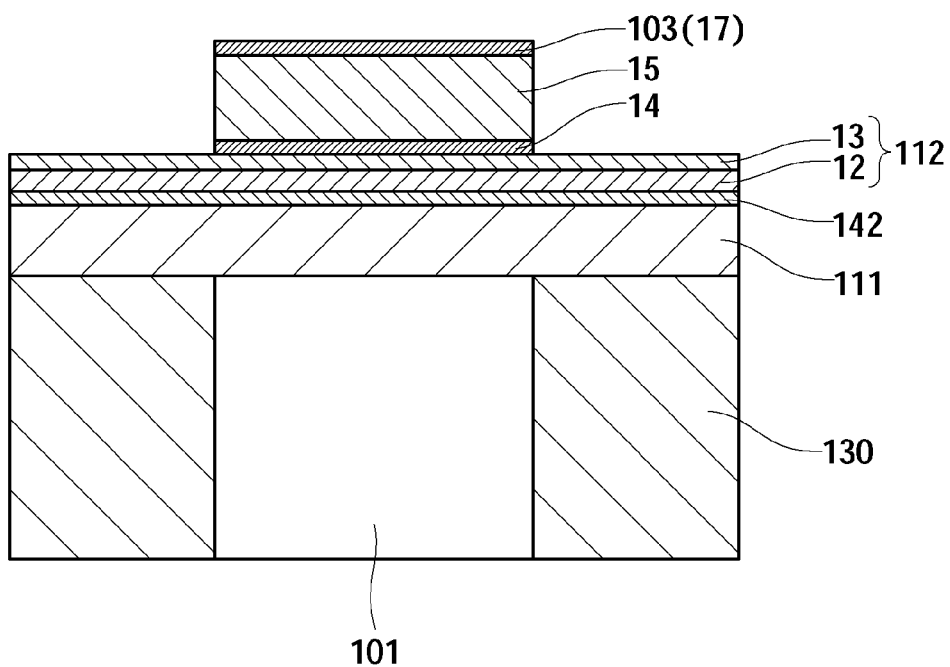
FIG. 12B is a schematic cross-sectional view for explaining the example of the method of manufacturing the ink jet head shown in FIG. 11.

The ink jet head 141 shown in FIG. 11 can be manufactured, for example, by a method shown in FIG. 12A and FIG. 12B. First, as shown in FIG. 12A, the vibration layer 111, the adhesive layer 142, the common electrode layer 112 (the metal electrode film 12 and the $LaNiO_3$ film 13), the $NaNbO_3$ film 14, the $(Bi, Na, Ba)TiO_3$ film 15, and the conductive film 17 are formed in this order on one of the main surfaces of the substrate 130. The technique for forming the respective layers and films is as mentioned above. Sputtering is preferably used as the technique.

In the present embodiment, when the substrate 130 is made of Si, it is possible to form the vibration layer 111 composed of silicon dioxide by oxidizing a surface of the substrate. In this case, the thickness of the vibration layer 111 can be 0.5 μm to 10 μm.

Next, as shown in FIG. 12B, the through-hole 101 is formed at the position of the substrate 130 where the pressure chamber 102 is to be formed. Subsequently, the conductive film 17, the (Bi, Na, Ba)TiO$_3$ film 15, and the NaNbO$_3$ film 14 are subject to microfabrication so that the center of the through-hole 101 coincides with the center of these layers when viewed from the direction perpendicular to the main surface of the substrate 130. The microfabrication transforms the conductive film 17 into the individual electrode layer 103. A well-known microfabrication technique that is a combination of patterning and etching can be used for the formation of the through-hole 101 and the microfabrication of these respective layers. A resist can be spin-coated for the patterning. As the etching, dry etching is preferred. Anisotropic dry etching is preferred for the formation of the through-hole 101. In dry etching, a gas mixture of argon and an organic gas containing fluorine atoms can be used. In the anisotropic dry etching, the gas mixture further can contain a sulfur hexafluoride gas.

Finally, the substrate 130 is bonded to the separately formed nozzle plate having the nozzle holes 108. Thus, the ink jet head 141 shown in FIG. 11 is obtained. When they are bonded, their alignment is adjusted, and thus this bonding allows the through-holes 101 to serve as the pressure chambers 102. The bonding method is not limited, and for example, an adhesive is used. The nozzle holes 108 can be formed in the nozzle plate by a microfabrication technique such as lithography, laser beam machining, and electric discharge machining.

[Image Forming Method with Ink Jet Head]

The image forming method of the present invention includes, in the above-described ink jet head of the present invention, a step of applying a voltage to the piezoelectric layer through the first and second electrodes (that is, the individual electrode layer and the common electrode layer) to displace, based on the piezoelectric effect, the vibration layer in its film thickness direction so that the volumetric capacity of the pressure chamber changes; and a step of ejecting the ink from the pressure chamber by the displacement to form an image.

The voltage to be applied to the piezoelectric layer is changed with the relative position between the ink jet head and an object like a sheet of paper, on which an image is to be formed, being changed, so as to control the timing of ink ejection from the ink jet head and the amount of ink ejected therefrom. As a result, an image is formed on the surface of the object. The term "image" used in the present specification includes a character. In other words, the image forming method of the present invention allows characters, drawings, graphics, etc. to be printed on an object like a sheet of paper on which they are to be formed. The method makes it possible to perform printing with rich expression.

[Angular Velocity Sensor]

Figure 13A:
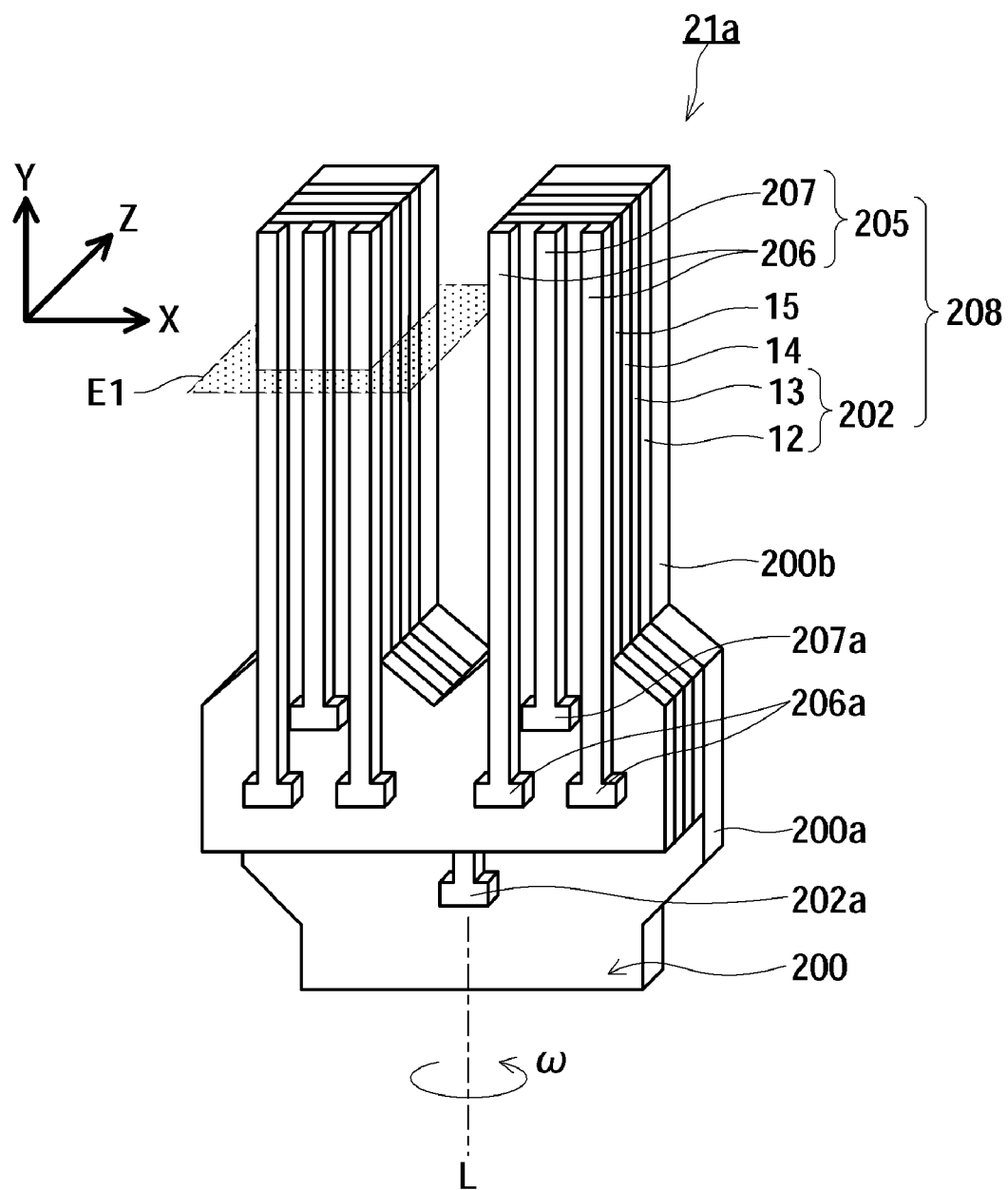
FIG. 13A is a perspective view schematically showing an example of an angular velocity sensor of the present invention.
Figure 13B:
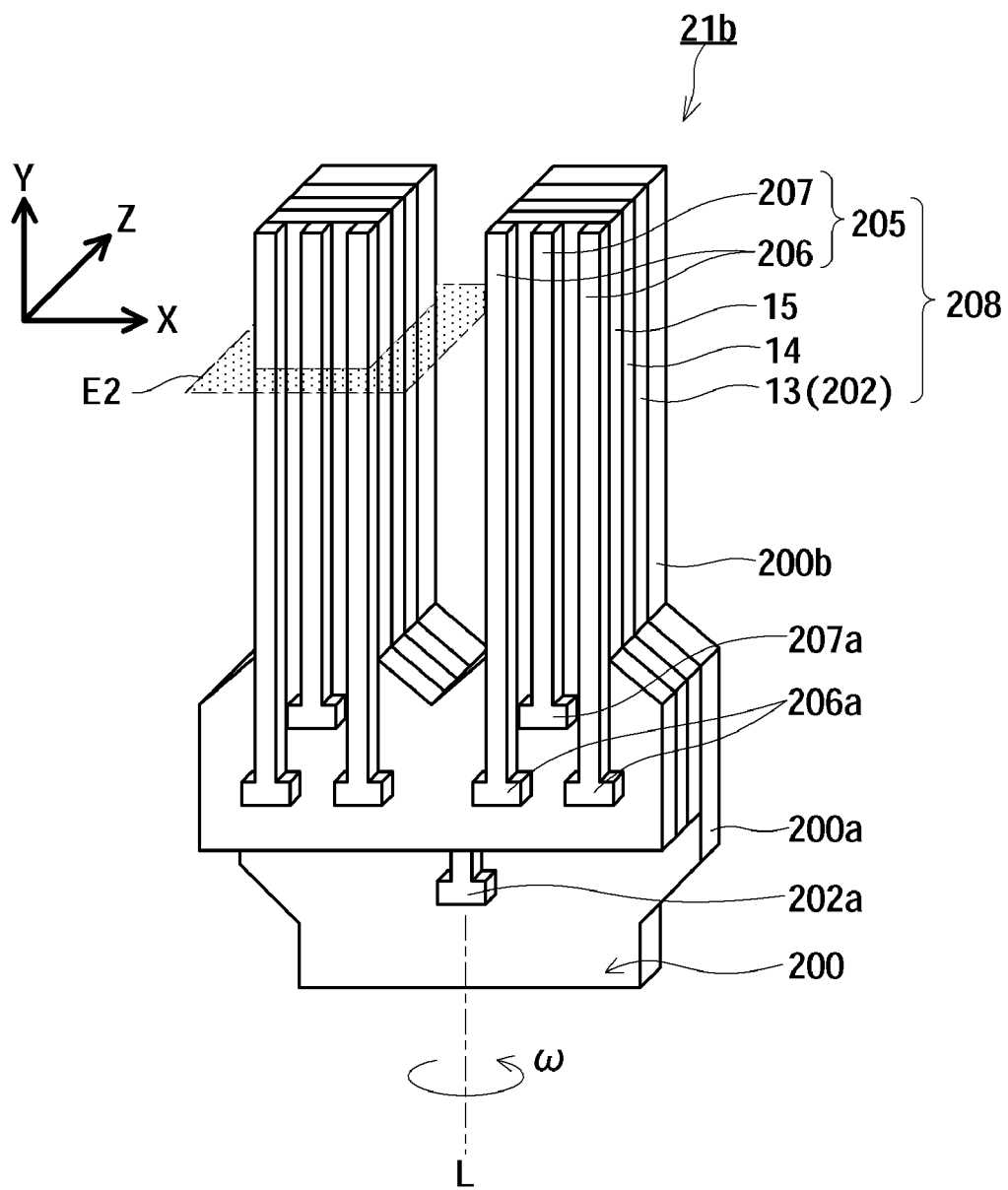
FIG. 13B is a perspective view schematically showing another example of the angular velocity sensor of the present invention.
Figure 14A:
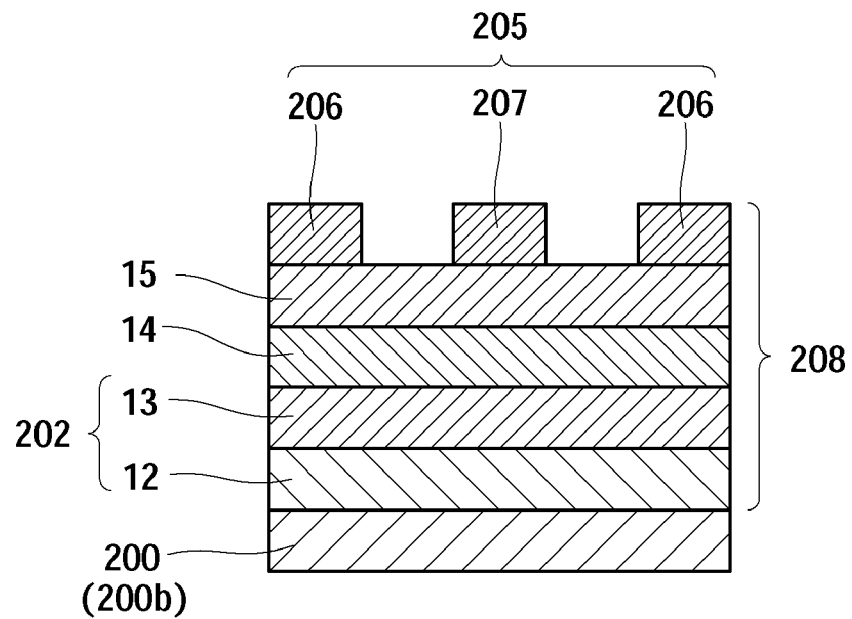
FIG. 14A is a cross-sectional view showing a cross section E1 of the angular velocity sensor shown in FIG. 13A.
Figure 14B:
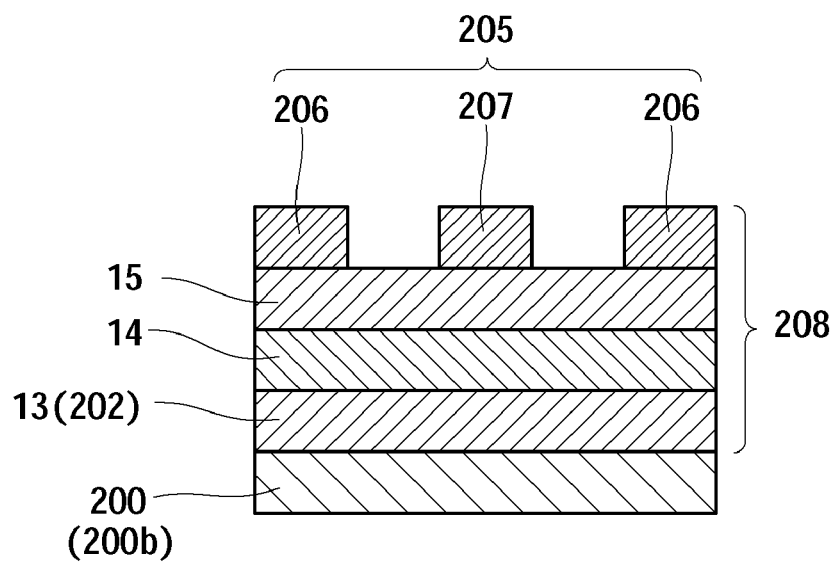
FIG. 14B is a cross-sectional view showing a cross section E2 of the angular velocity sensor shown in FIG. 13B.

FIG. 13A, FIG. 13B, FIG. 14A, and FIG. 14B show examples of an angular velocity sensor of the present invention. FIG. 14A shows a cross section E1 of an angular velocity sensor 21a shown in FIG. 13A. FIG. 14B shows a cross section E2 of an angular velocity sensor 21b shown in FIG. 13B. The angular velocity sensors 21a and 21b shown in FIG. 13A to FIG. 14B are so-called tuning-fork type angular velocity sensors. This type of angular velocity sensor can be used in a navigation apparatus for a vehicle, and as a sensor for correcting image blurring due to hand movement in a digital still camera.

The angular velocity sensors 21a and 21b shown in FIG. 13A to FIG. 14B each include a substrate 200 having vibration parts 200b and piezoelectric thin films 208 bonded to the vibration parts 200b.

The substrate 200 comprises a stationary part 200a and a pair of arms (vibration parts 200b) extending in a predetermined direction from the stationary part 200a. The direction in which the vibration parts 200b extend is the same as the direction in which the central axis of rotation L of the angular velocity measured by the angular velocity sensor 21 extends. Specifically, it is the Y direction in FIG. 13A and FIG. 13B. The substrate 200 has a shape of a tuning fork including two arms (vibration parts 200b), when viewed from the thickness direction of the substrate 200 (the Z direction in FIG. 13A and FIG. 13B).

The material composing the substrate 200 is not limited. The material is, for example, Si, glass, ceramic, or metal. The substrate 200 can be a monocrystalline Si substrate. The thickness of the substrate 200 is not limited as long as the functions of the angular velocity sensors 21a and 21b can develop. More specifically, the substrate 200 has a thickness of at least 0.1 mm but not more than 0.8 mm. The thickness of the stationary part 200a can be different from that of the vibration part 200b.

The piezoelectric thin film 208 is bonded to the vibration part 200b. The piezoelectric thin film 208 includes the (Bi, Na, Ba)TiO$_3$ film 15 that is a piezoelectric layer, the NaNbO$_3$ film 14 that is the interface layer, a first electrode 202, and a second electrode 205. The piezoelectric layer 15 is sandwiched between the first electrode 202 and the second electrode 205. The piezoelectric thin film 208 has a multilayer structure in which the first electrode 202, the NaNbO$_3$ film 14, the (Bi, Na, Ba)TiO$_3$ film 15, and the second electrode 205 are laminated in this order.

In the piezoelectric thin film 208 shown in FIG. 13A and FIG. 14A, the first electrode 202 is a laminate of the metal electrode film (preferably, the Pt film) 12 and the LaNiO$_3$ film 13. The LaNiO$_3$ film 13 is in contact with the NaNbO$_3$ film 14. The piezoelectric thin film 208 has a multilayer structure in which the metal electrode film 12, the LaNiO$_3$ film 13, the NaNbO$_3$ film 14, the (Bi, Na, Ba)TiO$_3$ film 15, and the second electrode 205 are laminated in this order. In other words, the piezoelectric thin film 208 shown in FIG. 13A and FIG. 14A is identical to the piezoelectric thin film 1d shown in FIG. 1D, with the second electrode 205 being considered as the conductive film 17.

In the piezoelectric thin film 208 shown in FIG. 13B and FIG. 14B, the first electrode 202 is the LaNiO$_3$ film 13. The piezoelectric thin film 208 has a multilayer structure in which the LaNiO$_3$ film 13, the NaNbO$_3$ film 14, the (Bi, Na, Ba)TiO$_3$ film 15, and the second electrode 205 are laminated in this order. In other words, the piezoelectric thin film 208 shown in FIG. 13B and FIG. 14B is identical to the piezoelectric thin film 1c shown in FIG. 1C, with the second electrode 205 being considered as the conductive film 17.

The metal electrode film 12, the LaNiO$_3$ film 13, the NaNbO$_3$ film 14, and the (Bi, Na, Ba)TiO$_3$ film 15 in each of the piezoelectric thin films 208 shown in FIG. 13A to FIG. 14B basically are the same as those in the piezoelectric thin film of the present invention that has been described above, including the preferred embodiments thereof.

The material composing the second electrode 205 is not limited, and it is, for example, Cu. The Cu electrode is preferable for the second electrode 205 because of its excellent adhesion to the (Bi, Na, Ba)TiO₃ film 15. The second electrode 205 can be a Pt electrode film or an Au electrode film having, on its surface, an adhesive layer made of a conductive material. The material composing the adhesive layer is, for example, Ti. Ti has high adhesion to the (Bi, Na, Ba)TiO₃ film.

The second electrode 205 comprises an electrode group including a drive electrode 206 and a sense electrode 207. The drive electrode 206 applies a driving voltage that oscillates the vibration part 200*b* to the piezoelectric layer 15. The sense electrode 207 measures a deformation of the vibration part 200*b* caused by an angular velocity applied to the vibration part 200*b*. The vibration part 200*b* usually oscillates in the width direction thereof (the X direction in FIG. 13A and FIG. 13B). More specifically, in the angular velocity sensors shown in FIG. 13A to FIG. 14B, a pair of drive electrodes 206 are provided on both of the width-direction edge portions of the vibration part 200*b* along the length direction thereof (the Y direction in FIG. 13A and FIG. 13B). Only one drive electrode 206 may be provided on one of the width-direction edge portions of the vibration part 200*b*. In the angular velocity sensors shown in FIG. 13A to FIG. 14B, the sense electrode 207 is provided along the length direction of the vibration part 200*b* and sandwiched between the pair of drive electrodes 206. A plurality of sense electrodes 207 may be provided on the vibration part 200*b*. The deformation of the vibration part 200*b* measured by the sense electrode 207 usually is a deflection in the thickness direction thereof (the Z direction in FIG. 13A and FIG. 13B).

In the angular velocity sensor of the present invention, one electrode selected from the first electrode and the second electrode can be composed of an electrode group including the drive electrode and the sense electrode. In each of the angular velocity sensors 21*a* and 21*b* shown in FIG. 13A to FIG. 14B, the second electrode 205 is composed of the electrode group. Unlike this angular velocity sensor, the first electrode 202 can be composed of the electrode group. As an example, the second electrode 205, the (Bi, Na, Ba)TiO₃ film 15, the NaNbO₃ film 14, and the first electrode 202 (the first electrode comprises the LaNiO₃ film 13 that is in contact with the NaNbO₃ film 14) can be laminated in this order, when viewed from the substrate 200.

The first electrode 202, the drive electrode 206, and the sense electrode 207 have connection terminals 202*a*, 206*a*, and 207*a*, respectively, formed at the end portions thereof. The shape and position of each of the connection terminals are not limited. In FIG. 13A and FIG. 13B, the connection terminals are provided on the stationary part 200*a*.

Preferably, the first electrode 202 has a thickness of at least 0.05 μm but not more than 1 μm. When the first electrode 202 is a laminate of the metal electrode film 12 and the LaNiO₃ film 13, it is preferable that the LaNiO₃ film 13 have a thickness of at least 0.05 μm but not more than 0.5 μm. Preferably, the NaNbO₃ film 14 has a thickness of at least 0.05 μm but not more than 0.5 μm. Preferably, the (Bi, Na, Ba)TiO₃ film 15 has a thickness of at least 0.5 μm but not more than 5 μm. Preferably, the second electrode 205 has a thickness of at least 0.05 μm but not more than 0.5 μm.

In the angular velocity sensors shown in FIG. 13A to FIG. 14B, the piezoelectric thin film 208 is bonded to both the vibration part 200*b* and the stationary part 200*a*. The bonding state of the piezoelectric thin film 208 is not limited as long as the piezoelectric thin film 208 can oscillate the vibration part 200*b* and measure the deformation of the vibration part 200*b*. For example, the piezoelectric thin film 208 may be bonded only to the vibration part 200*b*.

The angular velocity sensor of the present invention may have two or more vibration part groups each consisting of a pair of vibration parts 200*b*. Such an angular velocity sensor can serve as a biaxial or triaxial angular velocity sensor capable of measuring angular velocities each of which has different central axes of rotation. The angular velocity sensors shown in FIG. 13A to FIG. 14B each have one vibration part group consisting of a pair of vibration parts 200*b*.

The above-mentioned method of manufacturing a piezoelectric thin film of the present invention can be applied to the manufacture of the angular velocity sensor of the present invention. For example, the angular velocity sensor can be manufactured in the following manner. The following method is used in the case where the first electrode 202 comprises the metal electrode film 12. A person skilled in the art can apply the following method also to the case where the first electrode 202 does not comprise the metal electrode film 12.

First, the metal electrode film (preferably, the Pt film) 12, the LaNiO₃ film 13, the NaNbO₃ film 14, the (Bi, Na, Ba)TiO₃ film 15, and the conductive film 17 are formed on the surface of a substrate (for example, a Si substrate) in this order. The above-mentioned thin film formation techniques can be employed to form the respective layers and films. Sputtering is preferably used as the technique.

Next, the conductive film 17 is patterned using a microfabrication technique to form the second electrode 205 including the drive electrode 206 and the sense electrode 207. Furthermore, the (Bi, Na, Ba)TiO₃ film 15, the NaNbO₃ film 14, the LaNiO₃ film 13, and the metal electrode film 12 are patterned using a microfabrication technique. Then, the substrate is patterned using the microfabrication technique to form the vibration part 200*b*. In this manner, the angular velocity sensor of the present invention can be manufactured.

The microfabrication technique is, for example, dry etching.

A transfer technique using a base substrate can be applied to the manufacture of the angular velocity sensor of the present invention. Specifically, the following method can be used, for example. First, the metal electrode film 12, the LaNiO₃ film 13, the NaNbO₃ film 14, the (Bi, Na, Ba)TiO₃ film 15, and the conductive film 17 are formed on the surface of a base substrate in this order. Next, the laminate thus formed is bonded to another new substrate so that the substrate and the conductive film 17 are in contact with each other. Next, the base substrate is removed by a well-known technique. Next, the respective layers and films are patterned using a microfabrication technique. Thus, the angular velocity sensor of the present invention can be manufactured. The laminate and the new substrate can be bonded together via, for example, an adhesive layer. The material for the adhesive layer is not limited as long as the laminate is bonded stably to the new substrate. More specifically, an acrylic resin adhesive, an epoxy resin adhesive, a silicone adhesive, or a polyimide adhesive can be used. In this case, it is preferable that the adhesive layer have a thickness of at least 0.2 μm but not more than 1 μm.

[Method of Measuring Angular Velocity by Angular Velocity Sensor]

The angular velocity measuring method of the present invention uses the angular velocity sensor of the present invention, and includes the steps of: applying a driving voltage to the piezoelectric layer to oscillate the vibration part of the substrate; and measuring a deformation of the vibration part caused by an angular velocity applied to the oscillating vibration part to measure a value of the applied angular velocity. The driving voltage is applied between the drive electrode and one of the first electrode and the second electrode (the other electrode) that serves neither as the drive electrode nor as the sense electrode, and thus the driving voltage is applied to the piezoelectric layer. The sense electrode and the other electrode measure the deformation of the oscillating vibration part caused by the angular velocity.

Hereinafter, the angular velocity measuring method with the angular velocity sensors 21*a* and 21*b* shown in FIGS. 13A and 13B is described. A driving voltage having a frequency that resonates with the natural vibration of the vibration part 200*b* is applied to the (Bi, Na, Ba)TiO$_3$ film 15 that is a piezoelectric layer through the first electrode 202 and the drive electrode 206 so as to oscillate the vibration part 200*b*. The piezoelectric layer 15 is deformed in accordance with the waveform of the applied driving voltage, and the vibration part 200*b* bonded to the piezoelectric layer 15 oscillates. The driving voltage can be applied, for example, by grounding the first electrode 202 and changing the potential of the driving electrode 206 (in other words, the driving voltage is a potential difference between the first electrode 202 and the driving electrode 206.) The angular velocity sensors 21*a* and 21*b* each include a pair of vibration parts 200*b* that are arranged in the form of the tuning fork. Usually, reverse (positive and negative) voltages are applied to the drive electrodes 206 provided on the respective vibration parts 200*b* of the pair. This allows the respective vibration parts 200*b* to oscillate in the mode in which they vibrate in the directions opposite to each other (the mode in which they vibrate symmetrically with respect to the central axis of rotation L shown in FIGS. 13A and 13B). In the angular velocity sensors 21*a* and 21*b* shown in FIGS. 13A and 13B, the vibration parts 200*b* oscillate in their width direction (the X direction). The angular velocity can be measured by oscillating only one of the pair of vibration parts 200*b*. For accurate measurement, however, it is preferable to oscillate both of the vibration parts 200*b* in the mode in which they vibrate in the directions opposite to each other.

When an angular velocity ω with respect to the central axis of rotation L is applied to the angular velocity sensor 21*a* or 21*b* in which the vibration parts 200*b* are oscillating, the vibration parts 200*b* are deflected respectively in their thickness direction (the Z direction) by Coriolis force. In the case where the respective vibration parts 200*b* are oscillating in the opposite direction mode, they are deflected in the opposite directions by the same degree. The piezoelectric layer 15 bonded to the vibration part 200*b* is also deflected according to this deflection of the vibration part 200*b*. As a result, a potential difference is generated between the first electrode 202 and the sense electrode 207 in accordance with the deflection of the piezoelectric layer 15, that is, the magnitude of the generated Coriolis force. The angular velocity ω applied to the angular velocity sensor 21*a* or 21*b* can be measured by measuring the magnitude of the potential difference.

The following relationship between a Coriolis force Fc and an angular velocity ω is true:

$$Fc = 2mv\omega$$

where v is the velocity of the oscillating vibration part 200*b* in the oscillation direction, and m is the mass of the vibration part 200*b*. As shown in this equation, the angular velocity ω can be calculated from the Coriolis force Fc.

[Piezoelectric Generating Element]

Figure 15A:
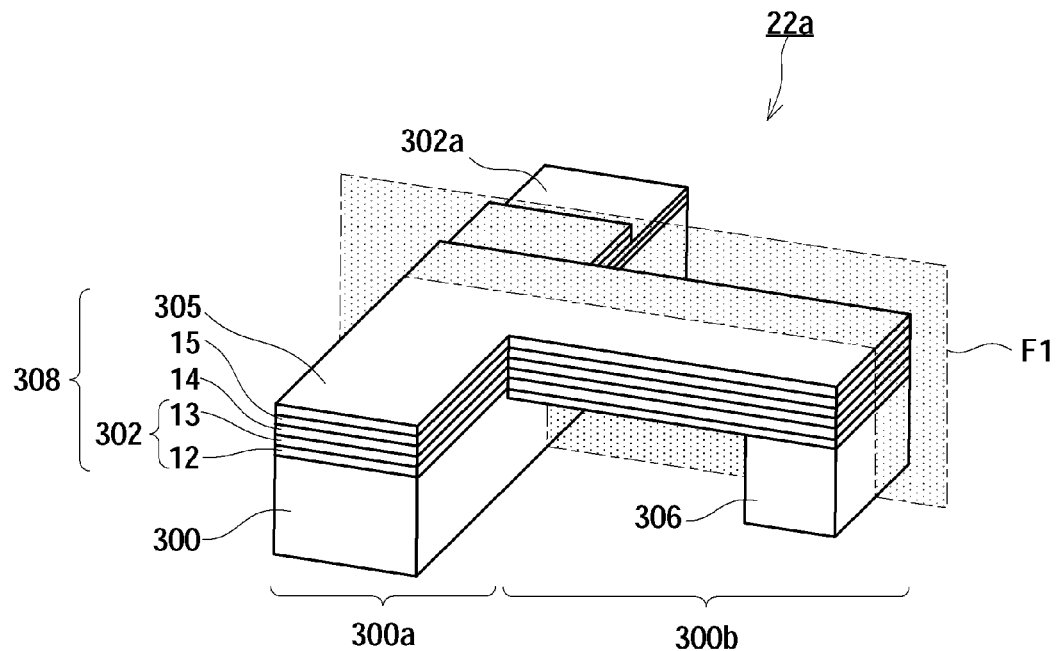
FIG. 15A is a perspective view schematically showing an example of a piezoelectric generating element of the present invention.
Figure 15B:
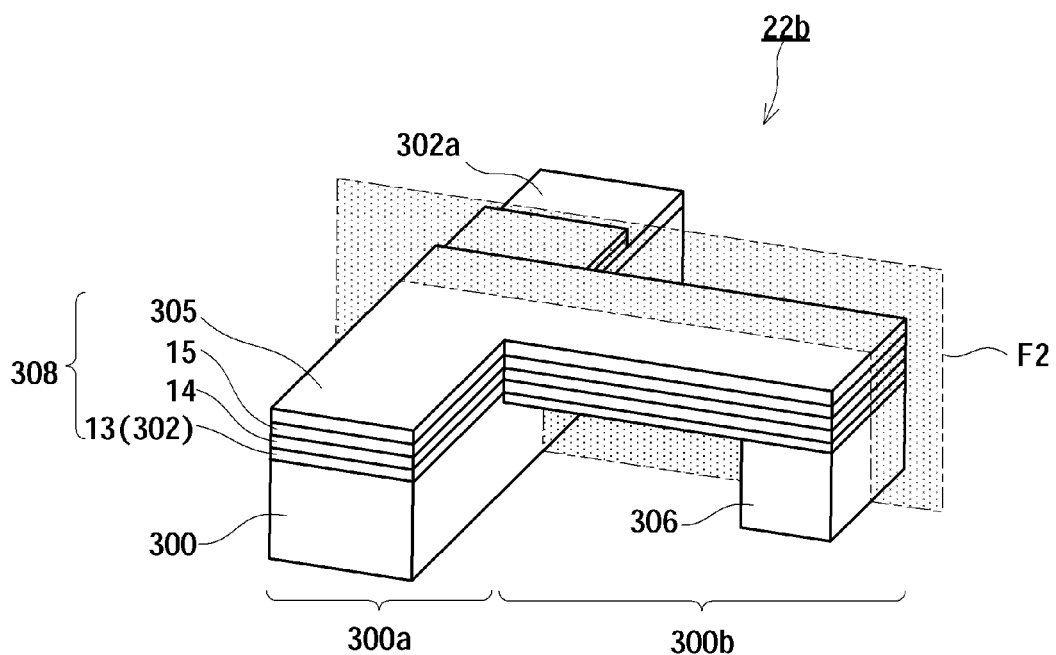
FIG. 15B is a perspective view schematically showing another example of the piezoelectric generating element of the present invention.
Figure 16A:
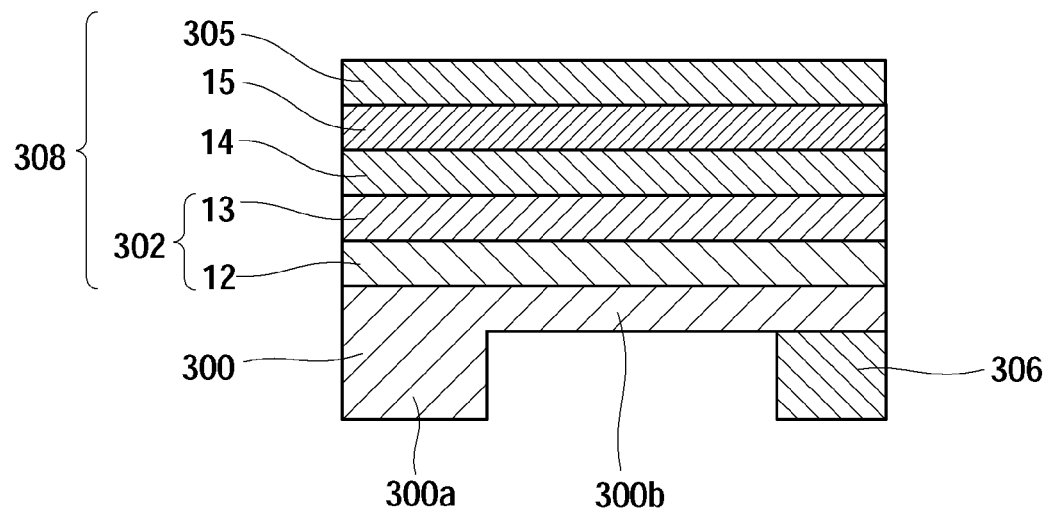
FIG. 16A is a cross-sectional view showing a cross section F1 of the piezoelectric generating element shown in FIG. 15A.
Figure 16B:
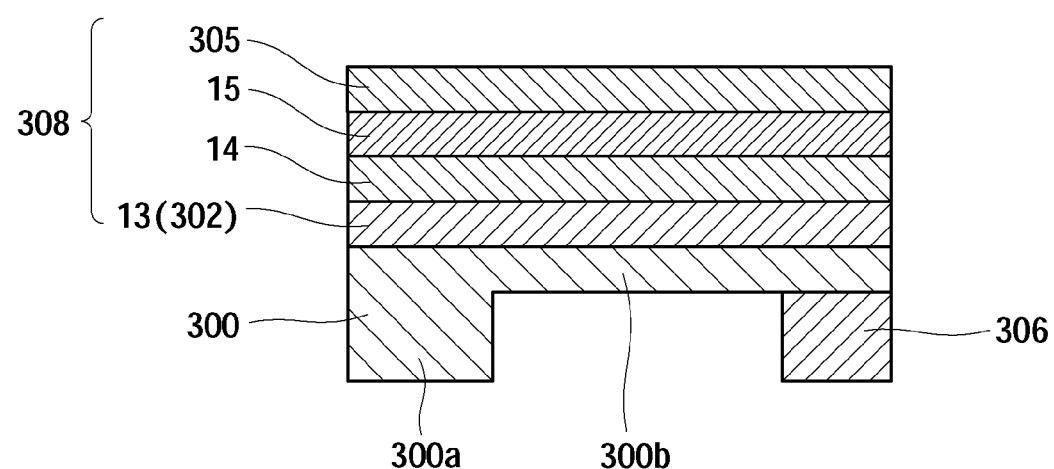
FIG. 16B is a cross-sectional view showing a cross section F2 of the piezoelectric generating element shown in FIG. 15B.

FIG. 15A, FIG. 15B, FIG. 16A, and FIG. 16B each show an example of the piezoelectric generating element of the present invention. FIG. 16A shows a cross section F1 of a piezoelectric generating element 22*a* shown in FIG. 15A. FIG. 16B shows a cross section F2 of a piezoelectric generating element 22*b* shown in FIG. 15B. The piezoelectric generating elements 22*a* and 22*b* are elements that convert externally-applied mechanical vibration into electrical energy. The piezoelectric generating elements 22*a* and 22*b* are applied suitably to a self-sustained power supply for generating electric power from various vibrations including engine vibrations and driving vibrations generated in vehicles and machines, and vibrations generated during walking.

The piezoelectric generating elements 22*a* and 22*b* shown in FIG. 15A to FIG. 16B each comprise a substrate 300 having a vibration part 300*b*, and a piezoelectric thin film 308 bonded to the vibration part 300*b*.

The substrate 300 has a stationary part 300*a*, and a vibration part 300*b* composed of a beam extending in a predetermined direction from the stationary part 300*a*. The material composing the stationary part 300*a* can be the same as the material composing the vibration part 300*b*. These materials may, however, be different from each other. The stationary part 300*a* and the vibration part 300*b* made of materials different from each other may be bonded to each other.

The material composing the substrate 300 is not limited. The material is, for example, Si, glass, ceramic, or metal. The substrate 300 can be a monocrystalline Si substrate. The substrate 300 has a thickness of, for example, at least 0.1 mm but not more than 0.8 mm. The stationary part 300*a* may have a thickness different from that of the vibration part 300*b*. The thickness of the vibration part 300*b* can be adjusted for efficient power generation by changing the resonance frequency of the vibration part 300*b*.

A weight load 306 is joined to the vibration part 300*b*. The weight load 306 adjusts the resonance frequency of the vibration part 300*b*. The weight load 306 is, for example, a vapor-deposited thin film of Ni. The material, shape, and mass of the weight load 306, as well as the position to which the weight load 306 is joined can be adjusted according to a desired resonance frequency of the vibration part 300*b*. The weight load may be omitted. The weight load is not necessary when the resonance frequency of the vibration part 300*b* is not adjusted.

The piezoelectric thin film 308 is bonded to the vibration part 300*b*. The piezoelectric thin film 308 includes the (Bi, Na, Ba)TiO$_3$ film 15 that is a piezoelectric layer, the NaNbO$_3$ film 14, a first electrode 302, and a second electrode 305. The (Bi, Na, Ba)TiO$_3$ film 15 is sandwiched between the first electrode 302 and the second electrode 305. The piezoelectric thin film 308 has a multilayer structure in which the first electrode 302, the NaNbO$_3$ film 14, the (Bi, Na, Ba)TiO$_3$ film 15, and the second electrode 305 are laminated in this order.

In the piezoelectric thin film 308 shown in FIG. 15A and FIG. 16A, the first electrode 302 is a laminate of the metal electrode film 12 and the LaNiO$_3$ film 13. The LaNiO$_3$ film 13 is in contact with the NaNbO$_3$ film 14. This piezoelectric thin film 308 has a multilayer structure in which the metal electrode film 12, the LaNiO$_3$ film 13, the NaNbO$_3$ film 14, the (Bi, Na, Ba)TiO$_3$ film 15, and the second electrode 305 are laminated in this order. In other words, the piezoelectric thin film 308 shown in FIG. 15A and FIG. 16A is identical to the multilayer structure 16*d* shown in FIG. 1D, with the second electrode 305 being considered as the conductive film 17.

In the piezoelectric thin film 308 shown in FIG. 15B and FIG. 16B, the first electrode 302 is the LaNiO$_3$ film 13. This piezoelectric thin film 308 has a multilayer structure in which the LaNiO$_3$ film 13, the NaNbO$_3$ film 14, the (Bi, Na, Ba)TiO$_3$ film 15, and the second electrode 305 are laminated in this order. In other words, the piezoelectric thin film 308 shown in FIG. 15B and FIG. 16B is identical to the multilayer structure 16c shown in FIG. 1C, with the second electrode 305 being considered as the conductive film 17.

The metal electrode film 12, the LaNiO$_3$ film 13, the NaNbO$_3$ film 14, and the (Bi, Na, Ba)TiO$_3$ film 15 in each of the piezoelectric thin films 308 shown in FIG. 15A to FIG. 16B basically are the same as those in the piezoelectric thin film of the present invention that has been described above, including the preferred embodiments thereof.

The second electrode 305 can be, for example, a Cu electrode film. The Cu electrode is preferable for the second electrode 305 because of its excellent adhesion to the (Bi, Na, Ba)TiO$_3$ film 15. The second electrode 305 can be a Pt electrode film or an Au electrode film having, on its surface, an adhesive layer made of a conductive material. The material composing the adhesive layer is, for example, Ti. Ti has high adhesion to the (Bi, Na, Ba)TiO$_3$ film.

In the piezoelectric generating elements shown in FIG. 15A to FIG. 16B, a part of the first electrode 302 is exposed. This part can serve as a connection terminal 302a.

Preferably, the first electrode 302 has a thickness of at least 0.05 µm but not more than 1 µm. When the first electrode 302 is a laminate of the metal electrode film 12 and the LaNiO$_3$ film 13, it is preferable that the LaNiO$_3$ film 13 have a thickness of at least 0.05 µm but not more than 0.5 µm. Preferably, the NaNbO$_3$ film 14 has a thickness of at least 0.05 µm but not more than 0.5 µm. Preferably, the (Bi, Na, Ba)TiO$_3$ film 15 has a thickness of at least 0.5 µm but not more than 5 µm. Preferably, the second electrode 305 has a thickness of at least 0.05 µm but not more than 0.5 µm.

In the piezoelectric generating elements shown in FIG. 15A to FIG. 16B, the first electrode 302, the NaNbO$_3$ film 14, the (Bi, Na, Ba)TiO$_3$ film 15, and the second electrode 305 are laminated in this order, when viewed from the side of the substrate 300 having the vibration part 300b. The order of lamination of these layers may be reversed. That is, the second electrode, the (Bi, Na, Ba)TiO$_3$ film, the NaNbO$_3$ film, and the first electrode (the first electrode comprises the LaNiO$_3$ film that is in contact with the NaNbO$_3$ film) can be laminated in this order, when viewed from the side of the substrate having the vibration part.

In the piezoelectric generating elements shown in FIG. 15A to FIG. 16B, the piezoelectric thin film 308 can be bonded to both of the vibration part 300b and the stationary part 300a. The piezoelectric thin film 308 can be bonded only to the vibration part 300b.

When the piezoelectric generating element of the present invention has a plurality of vibration parts 300b, an increased amount of electric power can be generated. Such a piezoelectric generating element can be applied to mechanical vibrations containing a wide range of frequency components if the plurality of vibration parts 300b have different resonance frequencies.

The above-mentioned manufacturing method of the piezoelectric thin film of the present invention can be applied to the manufacture of the piezoelectric generating element of the present invention. For example, the piezoelectric thin film can be manufactured in the following manner. The following method is used in the case where the first electrode 302 comprises the metal electrode film 12. A person skilled in the art can apply the following method also to the case where the first electrode 302 does not comprise the metal electrode film 12.

First, the metal electrode film (preferably, the Pt film) 12, the LaNiO$_3$ film 13, the NaNbO$_3$ film 14, the (Bi, Na, Ba)TiO$_3$ film 15, and the conductive film 17 are formed on the surface of a substrate (for example, a Si substrate) in this order. The above-mentioned thin film formation techniques can be employed to form the respective layers and films. Sputtering is preferably used as the technique.

Next, the conductive film 17 is patterned using a microfabrication technique to form the second electrode 305. Furthermore, the (Bi, Na, Ba)TiO$_3$ film 15, the NaNbO$_3$ film 14, the LaNiO$_3$ film 13, and the metal electrode film 12 are patterned using a microfabrication technique. The LaNiO$_3$ film 13 and the metal electrode film 12 are thus patterned to form the connection terminal 302a in parallel. Then, the substrate is patterned using the microfabrication technique to form the stationary part 300a and the vibration part 300b. The piezoelectric generating element of the present invention can be manufactured in this manner. In the case where the resonance frequency of the vibration part 300b needs to be adjusted, the weight load 306 is bonded to the vibration part 300b by a well-known method.

The microfabrication technique is, for example, dry etching.

A transfer technique using a base substrate can be applied to the manufacture of the piezoelectric generating element of the present invention. Specifically, the following method can be used, for example. First, the metal electrode film 12, the LaNiO$_3$ film 13, the NaNbO$_3$ film 14, the (Bi, Na, Ba)TiO$_3$ film 15, and the conductive film 17 are formed on the surface of a base substrate in this order. Next, the laminate thus formed is bonded to another new substrate so that the substrate and the conductive film 17 are in contact with each other. Next, the base substrate is removed by a well-known technique. Next, the respective layers and films are patterned using a microfabrication technique. Thus, the piezoelectric generating element of the present invention can be manufactured. The laminate and the new substrate can be bonded together via, for example, an adhesive layer. The material for the adhesive layer is not limited as long as the laminate is bonded stably to the new substrate. More specifically, an acrylic resin adhesive, an epoxy resin adhesive, a silicone adhesive, or a polyimide adhesive can be used. In this case, it is preferable that the adhesive layer have a thickness of at least 0.2 µm but not more than 1 µm.

[Method of Generating Electrical Power Using Piezoelectric Generating Element]

The above-described piezoelectric generating element of the present invention is vibrated to generate a potential difference between the first electrode and the second electrode and obtain electric power through the first electrode and the second electrode.

When mechanical vibration is applied externally to the piezoelectric generating element 22a or 22b, the vibration part 300b starts vibrating to produce vertical deflection with respect to the stationary part 300a. The piezoelectric effect produced by this vibration generates an electromotive force across the (Bi, Na, Ba)TiO$_3$ film 15 that is a piezoelectric layer. As a result, a potential difference is generated between the first electrode 302 and the second electrode 305 that sandwich the piezoelectric layer 15 therebetween. The higher piezoelectric performance of the piezoelectric layer 15 generates a larger potential difference between the first and second electrodes. Particularly in the case where the resonance frequency of the vibration part 300b is close to the frequency of mechanical vibration to be applied externally to the element, the amplitude of the vibration part 300b increases and thus the electric power generation characteristics are improved. Therefore, the weight load 306 is preferably used to adjust the resonance frequency of the vibration part 300b to be close to the frequency of mechanical vibration applied externally to the element.

EXAMPLES

Hereinafter, the present invention is described in more detail with reference to an example. The present invention is not limited to the following example.

Example

In Example, a piezoelectric thin film shown in FIG. 1E was produced. The piezoelectric thin film comprised the substrate 11, the metal electrode film 12, the $LaNiO_3$ film 13, the $NaNbO_3$ film (the interface layer) 14, the (Bi, Na, Ba)$TiO_3$ film (the piezoelectric layer) 15, and the conductive film 17 in this order. The piezoelectric thin film was produced as follows.

A Pt layer (with a thickness of 100 nm) having a (111) orientation was formed by RF magnetron sputtering on the surface, having a plane orientation of (100), of a monocrystalline Si substrate. The Pt layer corresponded to the metal electrode film 12. The Pt layer was formed using a metallic Pt target in an argon (Ar) gas atmosphere under the film formation conditions of an RF power of 15 W and a substrate temperature of 300° C. Before the Pt layer was formed, a Ti layer (with a thickness of 2.5 nm) had been formed on the surface of the monocrystalline Si substrate to improve the adhesion between the monocrystalline Si substrate and the Pt layer. The Ti layer was formed in the same manner as in the formation of the Pt layer, except that a metallic Ti target was used instead of the metallic Pt target.

Next, a $LaNiO_3$ film (with a thickness of 200 nm) having a (001) orientation was formed by RF magnetron sputtering on the surface of the Pt layer. The $LaNiO_3$ film 13 was formed using $LaNiO_3$ having a stoichiometric composition as a target in a mixed gas atmosphere of Ar and oxygen (with a flow ratio between Ar and $O_2$ of 80:20) under the film formation conditions of an RF power of 100 W and a substrate temperature of 300° C.

Next, a $NaNbO_3$ film (with a thickness of 100 nm) having a (001) orientation was formed by RF magnetron sputtering on the surface of the $LaNiO_3$ film. The $NaNbO_3$ film 14 was formed using $NaNbO_3$ having a stoichiometric composition as a target in a mixed gas atmosphere of Ar and oxygen (with a flow ratio between Ar and $O_2$ of 80:20) under the film formation conditions of an RF power of 100 W and a substrate temperature of 600° C.

Next, a $[(Bi_{0.5}Na_{0.5})TiO_3]_{0.93}$—$[BaTiO_3]_{0.07}$ film (with a thickness of 2.7 μm) was formed by RF magnetron sputtering on the surface of the $NaNbO_3$ film. The film corresponded to the (Bi, Na, Ba)$TiO_3$ film 15. The film 15 was formed using $[(Bi_{0.5}Na_{0.5})TiO_3]_{0.93}$—$[BaTiO_3]_{0.07}$ having a stoichiometric composition as a target in a mixed gas atmosphere of Ar and oxygen (with a flow ratio between Ar and $O_2$ of 50:50) under the film formation conditions of an RF power of 170 W and a substrate temperature of 650° C.

Figure 17:
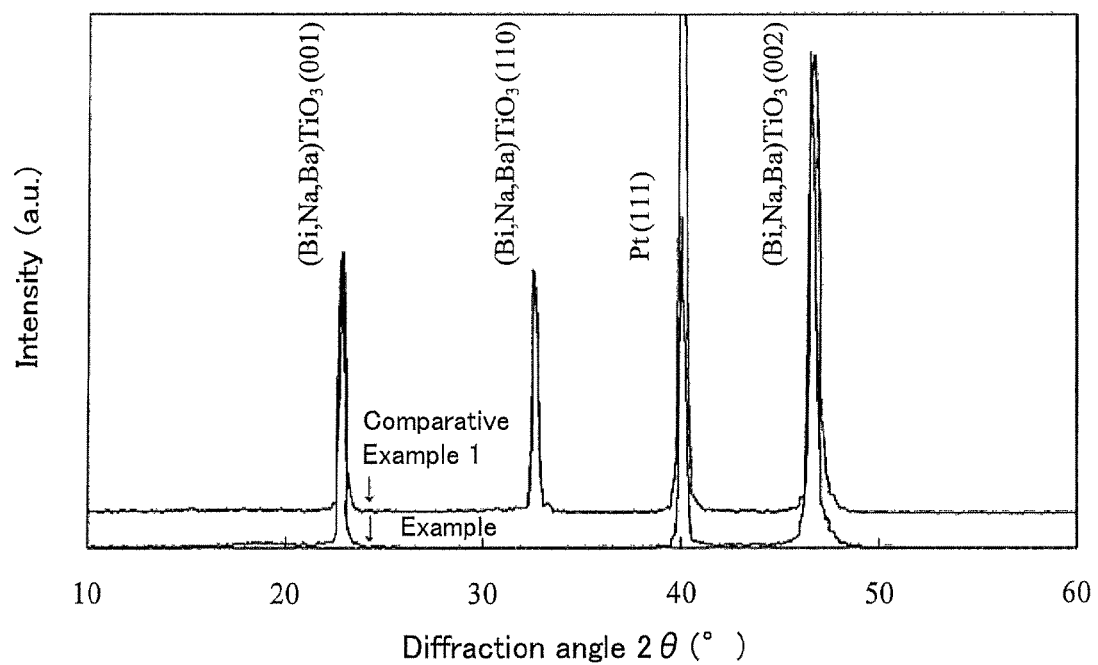
FIG. 17 is a diagram showing X-ray diffraction profiles of piezoelectric thin films fabricated in Example and Comparative Example 1.

The formed $[(Bi_{0.5}Na_{0.5})TiO_3]_{0.93}$—$[BaTiO_3]_{0.07}$ film (the (Bi, Na, Ba)$TiO_3$ film) was subject to an X-ray diffraction analysis to evaluate the crystal structure thereof. The X-ray diffraction analysis was carried out by allowing an X-ray beam to be incident on the (Bi, Na, Ba)$TiO_3$ film. FIG. 17 shows the results thereof. In Comparative Examples below, the same X-ray diffraction analysis was carried out.

FIG. 17 shows the obtained X-ray diffraction profile. This profile showed that only the reflection peaks derived from the (001)-oriented (Bi, Na, Ba)$TiO_3$ film, except for the reflection peaks derived from the Si substrate and the Pt layer, was observed. The intensity of the (001) reflection peak was 3,692 cps, which was a very high level. The profile shown in FIG. 17 indicates that the (Bi, Na, Ba)$TiO_3$ film produced in Example has an extremely high (001) orientation.

Subsequently, the half value width of the (001) reflection peak derived from the (Bi, Na, Ba)$TiO_3$ film in the profile was obtained by rocking curve measurement. The rocking curve measurement was made by scanning the incident angle ω of the X-ray beam incident on the specimen while setting a detector to a fixed diffraction angle of 2θ of the reflection peak to be measured. The measured half value width corresponded to the degree of inclination of a crystal axis with respect to a direction perpendicular to a main surface of the film. As the half value width was smaller, the crystallinity was higher. The measured half value width was a very small value of 2.81°. This means that the (Bi, Na, Ba)$TiO_3$ film produced in Example has extremely high crystallinity. In Comparative Examples below, the same rocking curve measurement was carried out.

Next, an Au layer (with a thickness of 100 nm) was formed by evaporation on the surface of the formed (Bi, Na, Ba)$TiO_3$ film. The Au layer corresponded to the conductive film 17. Thus, the piezoelectric thin film according to Example was produced.

Figure 18:
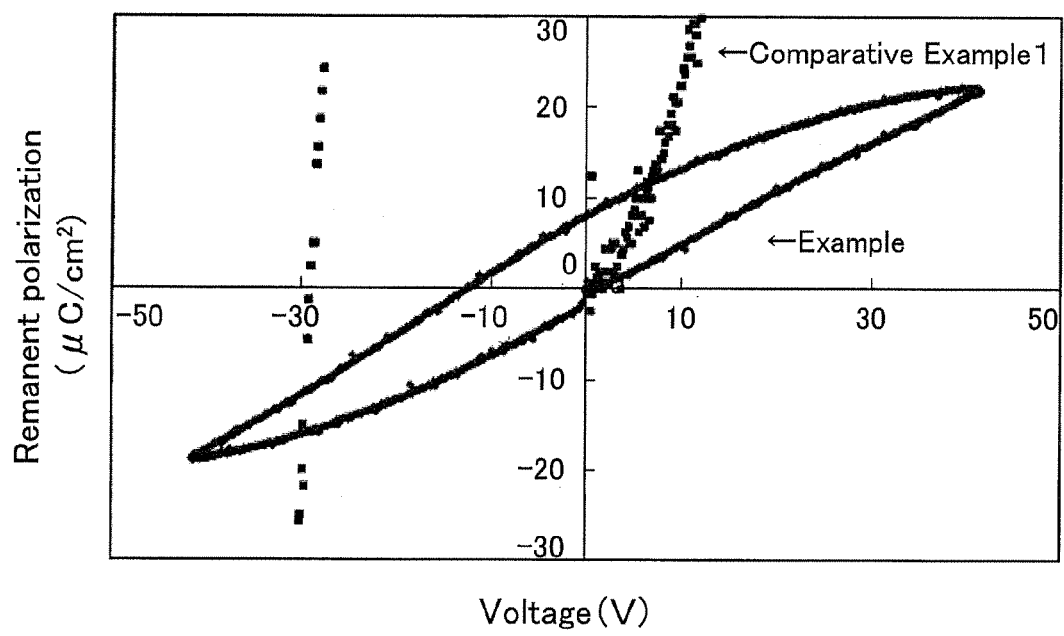
FIG. 18 is a diagram showing P-E hysteresis loops of the piezoelectric thin films fabricated in Example and Comparative Example 1.

The ferroelectric properties and piezoelectric performance of this piezoelectric thin film were evaluated using the Pt layer and the Au layer comprised in the piezoelectric thin film. FIG. 18 shows a P-E hysteresis loop of the piezoelectric thin film according to Example. As shown in FIG. 18, it was confirmed that the piezoelectric thin film exhibited better ferroelectric properties with an increase in the voltage applied to the piezoelectric layer through the Pt layer and the Au layer. An impedance analyzer was used to measure the dielectric loss (tan δ) at 1 kHz. As a result, the tan δ of the piezoelectric thin film was 4.3%. This means that the leak current of the piezoelectric thin film was small.

The piezoelectric performance of the piezoelectric thin film was evaluated in the following manner. The piezoelectric thin film was cut into a strip with a width of 2 mm and worked into a cantilever shape. Next, a potential difference was applied between the Pt layer and the Au layer, the cantilever was displaced, and the resulting displacement was measured with a laser displacement meter. Subsequently, the measured displacement was converted into a piezoelectric constant $d_{31}$. The piezoelectric performance was evaluated with this piezoelectric constant $d_{31}$. As a result, the piezoelectric constant $d_{31}$ of the piezoelectric thin film produced in Example was −93 pC/N.

Comparative Example 1

Figure 19:
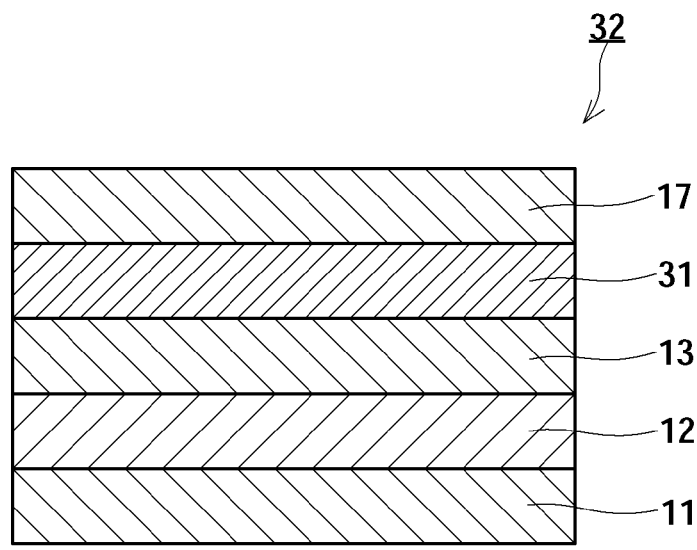
FIG. 19 is a cross-sectional view schematically showing a structure of the piezoelectric thin film fabricated in Comparative Example 1.

In Comparative Example 1, a piezoelectric thin film having a structure shown in FIG. 19 was produced. The piezoelectric thin film had the same structure as that of the piezoelectric thin film produced in Example, except that it did not comprise the $NaNbO_3$ film 14. More specifically, in this piezoelectric thin film, the substrate 11, the metal electrode film 12, the $LaNiO_3$ film 13, a (Bi, Na, Ba)$TiO_3$ film 31 that is a piezoelectric layer, and the conductive film 17 were laminated in this order. The piezoelectric thin film was produced in the same manner as in Example, except that the $NaNbO_3$ film 14 was not formed.

As shown in FIG. 17, the reflection peaks derived from the (001)-oriented (Bi, Na, Ba)$TiO_3$ film was observed also in Comparative Example 1 that did not comprise the $NaNbO_3$ film. However, a reflection peak derived from another crystal orientation (110) of the (Bi, Na, Ba) $TiO_3$ film was observed as well. The intensity of the (001) reflection peak was 2,661 cps, which was a lower level than the peak intensity (3,692 cps) in Example. This means that the (Bi, Na, Ba)TiO₃ film in Comparative Example 1 has a lower degree of orientation than the (Bi, Na, Ba)TiO₃ film in Example.

The half value width of the (001) reflection peak was 2.89°, which was greater than the half value width in Example. This means that the (Bi, Na, Ba)TiO₃ film in Comparative Example 1 has a lower degree of orientation than the (Bi, Na, Ba)TiO₃ film in Example.

Next, an Au layer (with a thickness of 100 nm) was formed by evaporation on the surface of the (Bi, Na, Ba)TiO₃ film 31. Thus, the piezoelectric thin film according to Comparative Example 1 was produced.

An attempt was made to evaluate the ferroelectric properties and piezoelectric performance of this piezoelectric thin film using the Pt layer and the Au layer comprised in the piezoelectric thin film. However, a very large leak current in the piezoelectric thin film made it difficult to obtain an accurate P-E hysteresis loop (see FIG. 18). Tan δ of the piezoelectric thin film was 40%. Since the piezoelectric thin film according to Comparative Example 1 had such a large leak current, it was difficult to obtain an accurate value of the piezoelectric constant $d_{31}$. Presumably, the piezoelectric constant $d_{31}$ thereof was about −40 pC/N.

Comparative Example 2

Figure 20:
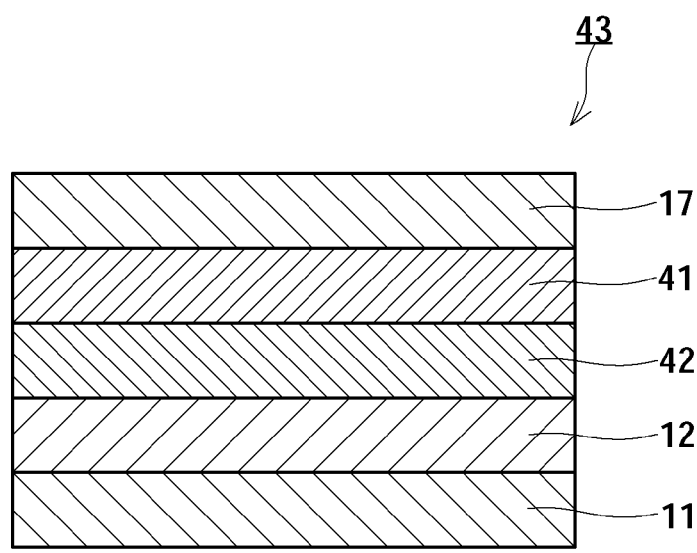
FIG. 20 is a cross-sectional view schematically showing a structure of a piezoelectric thin film produced in Comparative Example 2.

In Comparative Example 2, a piezoelectric thin film having a structure shown in FIG. 20 was produced. The piezoelectric thin film had the same structure as that of the piezoelectric thin film produced in Example, except that it did not comprise the LaNiO₃ film 13. In the piezoelectric thin film, the substrate 11, the metal electrode film 12, a NaNbO₃ film 42, a (Bi, Na, Ba)TiO₃ film 41 that was a piezoelectric layer, and the conductive film 17 were laminated in this order. The piezoelectric thin film was produced in the same manner as in Example, except that the LaNiO₃ film 13 was not formed.

Figure 21:
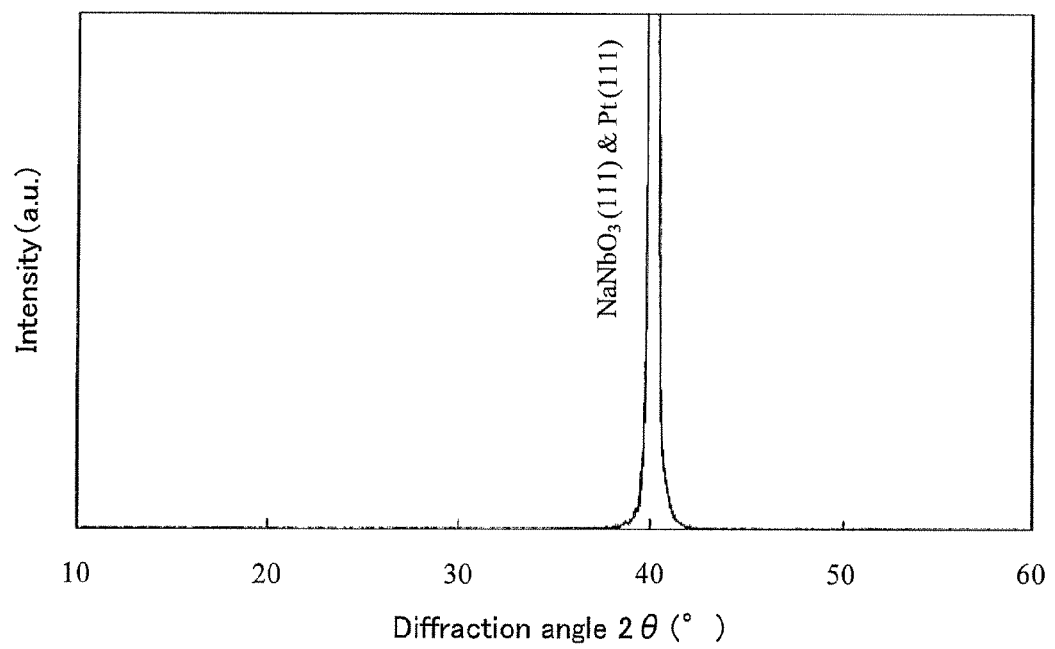
FIG. 21 is a diagram showing an X-ray diffraction profile of the piezoelectric thin film produced in Comparative Example 2.

FIG. 21 shows the result of the X-ray diffraction analysis of the NaNbO₃ film 42 for the evaluation of the crystal structure thereof. The measurement had been performed before the (Bi, Na, Ba)TiO₃ film 41 was formed. As shown in FIG. 21, the (111) reflection peak derived from the Pt layer and the (111) reflection peak derived from the (111)-oriented NaNbO₃ film 42 were only observed. That is, the NaNbO₃ film formed on the (111)-oriented Pt layer had a (111) orientation when the LaNiO₃ film 13 had not been formed. That is, the (001)-oriented NaNbO₃ film needed for forming the (001)-oriented (Bi, Na, Ba)TiO₃ film was not formed.

The (111)-oriented NaNbO₃ film is not appropriate for forming the (001)-oriented (Bi, Na, Ba)TiO₃ film. That is, it is presumed that the (Bi, Na, Ba)TiO₃ film 41 has neither (001) orientation nor high piezoelectric performance.

Table 1 below summarizes the evaluation results of Example and Comparative Example 1.

TABLE 1

| | Interface layer | (001) orientation of piezoelectric layer | | Dielectric loss (%) | Piezoelectric constant $d_{31}$ (pC/N) |
| | | (001) peak intensity (cps) | (001) peak half value width (°) | | |
|---|---|---|---|---|---|
| Example | NaNbO₃ | 3,692 | 2.81 | 4.3 | −93 |
| Com. Example 1 | Not included | 2,661 | 2.89 | 40 | −40 |

As shown in Table 1, the (001)-oriented NaNbO₃ film formed on the (001)-oriented LaNiO₃ film was useful for obtaining the (Bi, Na, Ba)TiO₃ film having a high (001) orientation and high crystallinity. Comparative Example 1 indicates that in the case where the NaNbO₃ film is not used, it is not possible to obtain the (Bi, Na, Ba)TiO₃ film having a high (001) orientation and high crystallinity. Comparative Example 2 indicates that the (001)-oriented LaNiO₃ film is necessary to obtain the NaNbO₃ film. The dielectric loss reflecting the leak current of the piezoelectric thin film also shows the same results.

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

INDUSTRIAL APPLICABILITY

The (Bi, Na, Ba)TiO₃ piezoelectric layer of the piezoelectric thin film of the present invention has high crystallinity, high (001) orientation, and a small leak current, and therefore the piezoelectric thin film has high ferroelectric properties (low dielectric loss, for example) and high piezoelectric performance. The piezoelectric thin film of the present invention is useful as a piezoelectric thin film alternative to existing lead-containing oxide ferroelectrics. The piezoelectric thin film of the present invention can be used suitably for applications such as pyroelectric sensors and piezoelectric devices in which piezoelectric thin films are used. Examples of such applications are the ink jet head, angular velocity sensor and piezoelectric generating element of the present invention.

The ink jet head of the present invention has excellent ink ejection characteristics although it does not contain a lead-containing ferroelectric material such as PZT. The method of forming an image with this ink jet head has high image forming accuracy and high expressivity. The angular velocity sensor of the present invention has high sensitivity although it does not contain a lead-containing ferroelectric material such as PZT. The method of measuring an angular velocity with this angular velocity sensor has excellent measurement sensitivity. The piezoelectric generating element of the present invention has excellent electric power generation characteristics although it does not contain a lead-containing ferroelectric material such as PZT. The electric power generation method of the present invention with this piezoelectric generating element has high electric power generation efficiency. The ink jet head, angular velocity sensor and piezoelectric generating element, and the image forming method, angular velocity measurement method and electric power generation method according to the present invention can be widely applied to various fields and uses.

What is claimed is:

1. A piezoelectric thin film comprising:
   a LaNiO₃ film having a (001) orientation;
   a NaNbO₃ film having a (001) orientation; and
   a (Bi, Na, Ba)TiO₃ film having a (001) orientation,
   wherein the LaNiO₃ film, the NaNbO₃ film, and the (Bi, Na, Ba)TiO₃ film are laminated in this order.

2. The piezoelectric thin film according to claim 1, further comprising a Pt film,
   wherein the LaNiO₃ film is formed on the Pt film.

3. The piezoelectric thin film according to claim 1, further comprising a conductive film.

wherein the (Bi, Na, Ba)TiO$_3$ film is sandwiched between the conductive film and the NaNbO$_3$ film.

4. The piezoelectric thin film according to claim 1, further comprising a substrate,
wherein the LaNiO$_3$ film is sandwiched between the substrate and the NaNbO$_3$ film.

5. The piezoelectric thin film according to claim 4, wherein the substrate is made of Si.

6. An ink jet head comprising:
a piezoelectric thin film having a piezoelectric layer sandwiched between a first electrode and a second electrode;
a vibration layer bonded to the piezoelectric thin film; and
a pressure chamber member having a pressure chamber for storing ink and bonded to a surface of the vibration layer opposite to a surface to which the piezoelectric thin film is bonded,
wherein the vibration layer is bonded to the piezoelectric thin film so that the vibration layer is displaceable in its film thickness direction according to a deformation of the piezoelectric thin film produced by a piezoelectric effect,
the vibration layer and the pressure chamber member are bonded to each other so that a volumetric capacity of the pressure chamber changes according to a displacement of the vibration layer and so that the ink in the pressure chamber is ejected according to a change in the volumetric capacity of the pressure chamber,
the first electrode comprises a LaNiO$_3$ film having a (001) orientation,
the piezoelectric layer is composed of a (Bi, Na, Ba)TiO$_3$ film having a (001) orientation,
a NaNbO$_3$ film having a (001) orientation is sandwiched between the first electrode and the piezoelectric layer, and
the LaNiO$_3$ film, the NaNbO$_3$ film, the (Bi, Na, Ba)TiO$_3$ film, and the second electrode are laminated in this order.

7. The ink jet head according to claim 6, wherein the piezoelectric thin film further comprises a Pt film, and the LaNiO$_3$ film is formed on the Pt film.

8. A method of forming an image with an ink jet head, comprising:
preparing the ink jet head, wherein
the ink jet head comprises:
a piezoelectric thin film having a piezoelectric layer sandwiched between a first electrode and a second electrode;
a vibration layer bonded to the piezoelectric thin film; and
a pressure chamber member having a pressure chamber for storing ink and bonded to a surface of the vibration layer opposite to a surface to which the piezoelectric thin film is bonded,
the vibration layer is bonded to the piezoelectric thin film so that the vibration layer is displaceable in its film thickness direction according to a deformation of the piezoelectric thin film produced by a piezoelectric effect,
the vibration layer and the pressure chamber member are bonded to each other so that a volumetric capacity of the pressure chamber changes according to a displacement of the vibration layer and so that the ink in the pressure chamber is ejected according to a change in the volumetric capacity of the pressure chamber,
the first electrode comprises a LaNiO$_3$ film having a (001) orientation,
the piezoelectric layer is composed of a (Bi, Na, Ba)TiO$_3$ film having a (001) orientation,
a NaNbO$_3$ film having a (001) orientation is sandwiched between the first electrode and the piezoelectric layer, and
the LaNiO$_3$ film, the NaNbO$_3$ film, the (Bi, Na, Ba)TiO$_3$ film, and the second electrode are laminated in this order; and
applying a voltage to the piezoelectric layer through the first electrode and the second electrode to displace, based on the piezoelectric effect, the vibration layer in its film thickness direction so that the volumetric capacity of the pressure chamber changes and the ink is ejected from the pressure chamber by the displacement, to form an image.

9. The method according to claim 8, wherein
the piezoelectric thin film further comprises a Pt film, and the LaNiO$_3$ film is formed on the Pt film.

10. An angular velocity sensor comprising:
a substrate having a vibration part; and
a piezoelectric thin film bonded to the vibration part and having a piezoelectric layer sandwiched between a first electrode and a second electrode,
wherein the first electrode comprises a LaNiO$_3$ film having a (001) orientation,
the piezoelectric layer is composed of a (Bi, Na, Ba)TiO$_3$ film having a (001) orientation,
a NaNbO$_3$ film having a (001) orientation is sandwiched between the first electrode and the piezoelectric layer,
the LaNiO$_3$ film, the NaNbO$_3$ film, the (Bi, Na, Ba)TiO$_3$ film, and the second electrode are laminated in this order, and
one of the first electrode and second electrode includes a drive electrode for applying a driving voltage that oscillates the vibration part to the piezoelectric layer and a sense electrode for measuring a deformation of the vibration part caused by an angular velocity applied to the vibration part that is oscillating.

11. The angular velocity sensor according to claim 10, wherein
the piezoelectric thin film further comprises a Pt film, and the LaNiO$_3$ film is formed on the Pt film.

12. A method of measuring an angular velocity with an angular velocity sensor, comprising:
preparing the angular velocity sensor, wherein
the angular velocity sensor comprises:
a substrate having a vibration part; and
a piezoelectric thin film bonded to the vibration part and having a piezoelectric layer sandwiched between a first electrode and a second electrode,
the first electrode comprises a LaNiO$_3$ film having a (001) orientation,
the piezoelectric layer is composed of a (Bi, Na, Ba)TiO$_3$ film having a (001) orientation,
a NaNbO$_3$ film having a (001) orientation is sandwiched between the first electrode and the piezoelectric layer,
the LaNiO$_3$ film, the NaNbO$_3$ film, the (Bi, Na, Ba)TiO$_3$ film, and the second electrode are laminated in this order, and
one of the first electrode and second electrode includes a drive electrode and a sense electrode;
applying a driving voltage to the piezoelectric layer through the drive electrode and the other one of the first electrode and the second electrode to oscillate the vibration part; and
measuring, through the sense electrode and the other one of the first electrode and the second electrode, a deformation of the vibration part caused by an angular velocity applied to the vibration part that is oscillating, to measure a value of the applied angular velocity.

13. The method according to claim 12, wherein
the piezoelectric thin film further comprises a Pt film, and the LaNiO$_3$ film is formed on the Pt film.

14. A piezoelectric generating element comprising:
a substrate having a vibration part; and
a piezoelectric thin film bonded to the vibration part and having a piezoelectric layer sandwiched between a first electrode and a second electrode,
wherein the first electrode comprises a LaNiO$_3$ film having a (001) orientation,
the piezoelectric layer is composed of a (Bi, Na, Ba)TiO$_3$ film having a (001) orientation,
a NaNbO$_3$ film having a (001) orientation is sandwiched between the first electrode and the piezoelectric layer, and
the LaNiO$_3$ film, the NaNbO$_3$ film, the (Bi, Na, Ba)TiO$_3$ film, and the second electrode are laminated in this order.

15. The piezoelectric generating element according to claim 14, wherein
the piezoelectric thin film further comprises a Pt film, and the LaNiO$_3$ film is formed on the Pt film.

16. A method of generating electric power with a piezoelectric generating element, comprising:
preparing the piezoelectric generating element, wherein the piezoelectric generating element comprises:
a substrate having a vibration part; and
a piezoelectric thin film bonded to the vibration part and having a piezoelectric layer sandwiched between a first electrode and a second electrode,
the first electrode comprises a LaNiO$_3$ film having a (001) orientation,
the piezoelectric layer is composed of a (Bi, Na, Ba)TiO$_3$ film having a (001) orientation,
a NaNbO$_3$ film having a (001) orientation is sandwiched between the first electrode and the piezoelectric layer, and
the LaNiO$_3$ film, the NaNbO$_3$ film, the (Bi, Na, Ba)TiO$_3$ film, and the second electrode are laminated in this order; and
vibrating the vibration part to generate a potential difference between the first electrode and the second electrode.

17. The method according to claim 16, wherein
the piezoelectric thin film further comprises a Pt film, and the LaNiO$_3$ film is formed on the Pt film.

* * * * *

UNITED STATES PATENT AND TRADEMARK OFFICE
CERTIFICATE OF CORRECTION

PATENT NO. : 8,288,020 B2
APPLICATION NO. : 12/956772
DATED : October 16, 2012
INVENTOR(S) : Takakiyo Harigai et al.

It is certified that error appears in the above-identified patent and that said Letters Patent is hereby corrected as shown below:

In the Claims:

At column 28, claim number 3, line number 67, a "." should be replaced with a ",".

Claim 3 should read as follows:

The piezoelectric thin film according to claim 1, further comprising a conductive film, [[.]]

wherein the (Bi, Na, Ba)TiO$_3$ film is sandwiched between the conductive film and the NaNbO$_3$ film.

Signed and Sealed this
Seventh Day of May, 2013

Teresa Stanek Rea
*Acting Director of the United States Patent and Trademark Office*